(12) United States Patent
Sheen et al.

(10) Patent No.: US 9,749,744 B2
(45) Date of Patent: *Aug. 29, 2017

(54) PLAYBACK DEVICE CALIBRATION

(71) Applicant: Sonos, Inc., Santa Barbara, CA (US)

(72) Inventors: Timothy Sheen, Brighton, MA (US); Ananth Jasty, Waltham, MA (US); Aurelio Ramos, Jamaica Plain, MA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/884,001

(22) Filed: Oct. 15, 2015

(65) Prior Publication Data

US 2016/0044413 A1   Feb. 11, 2016

Related U.S. Application Data

(63) Continuation of application No. 14/682,182, filed on Apr. 9, 2015, which is a continuation of application (Continued)

(51) Int. Cl.
*H04B 3/00* (2006.01)
*H04R 3/04* (2006.01)
(Continued)

(52) U.S. Cl.
CPC .............. *H04R 3/04* (2013.01); *G06F 3/165* (2013.01); *H03G 3/20* (2013.01); *H03G 5/005* (2013.01);
(Continued)

(58) Field of Classification Search
CPC ... H04R 3/04; H04R 1/22; H04R 5/04; H04R 2227/005; H04R 25/48; H04S 7/307
(Continued)

(56) References Cited

U.S. PATENT DOCUMENTS 4,306,113 A     12/1981   Morton
4,342,104 A  *  7/1982    Jack ..................... G10L 21/00
                                                           367/132
(Continued)

FOREIGN PATENT DOCUMENTS

EP        0772374 A2    5/1997
EP        1133896 B1    8/2002
(Continued)

OTHER PUBLICATIONS

Burger, Dennis, "Automated Room Correction Explained," hometheaterreview.com, Nov. 18, 2013, Retrieved Oct. 10, 2014, 3 pages.
(Continued)

*Primary Examiner* — Disler Paul
(74) *Attorney, Agent, or Firm* — McDonnell Boehnen Hulbert & Berghoff LLP

(57) ABSTRACT

Systems and methods are provided for device playback calibration. An example implementation involves a computing device receiving, via a microphone, detected audio content rendered by at least one playback device. The implementation also involves the computing device modulating the detected audio content with a modulation signal such that the modulation signal has a modulation frequency determined based on an input frequency range of a processing unit. The implementation also involves providing the modulated audio content to the processing unit; and determining, via the processing unit, an equalization setting for the at least one playback device.

20 Claims, 11 Drawing Sheets

Related U.S. Application Data

No. 13/536,493, filed on Jun. 28, 2012, now Pat. No. 9,106,192.

(51) Int. Cl.

| | |
|---|---|
| *G06F 3/16* | (2006.01) |
| *H03G 3/20* | (2006.01) |
| *H03G 5/00* | (2006.01) |
| *H03G 5/16* | (2006.01) |
| *H04R 1/22* | (2006.01) |
| *H04R 3/12* | (2006.01) |
| *H04R 5/04* | (2006.01) |
| *H04R 27/00* | (2006.01) |
| *H04R 29/00* | (2006.01) |
| *H04S 1/00* | (2006.01) |
| *H04S 7/00* | (2006.01) |

(52) U.S. Cl.
CPC .............. *H03G 5/165* (2013.01); *H04R 1/22* (2013.01); *H04R 3/12* (2013.01); *H04R 5/04* (2013.01); *H04R 27/00* (2013.01); *H04R 29/001* (2013.01); *H04R 29/008* (2013.01); *H04S 1/007* (2013.01); *H04S 7/301* (2013.01); *H04R 2227/005* (2013.01)

(58) Field of Classification Search
USPC ...................... 381/56–59, 103, 77; 333/28 R
See application file for complete search history.

(56) References Cited

U.S. PATENT DOCUMENTS

| | | | |
|---|---|---|---|
| 4,504,704 A | 3/1985 | Ohyaba et al. | |
| 4,592,088 A | 5/1986 | Shimada | |
| 4,631,749 A | 12/1986 | Rapaich | |
| 4,694,484 A | 9/1987 | Atkinson et al. | |
| 4,995,778 A | 2/1991 | Bruessel | |
| 5,218,710 A | 6/1993 | Yamaki et al. | |
| 5,255,326 A | 10/1993 | Stevenson | |
| 5,323,257 A | 6/1994 | Abe et al. | |
| 5,386,478 A | 1/1995 | Plunkett | |
| 5,440,644 A | 8/1995 | Farinelli et al. | |
| 5,553,147 A | 9/1996 | Pineau | |
| 5,581,621 A | 12/1996 | Koyama et al. | |
| 5,761,320 A | 6/1998 | Farinelli et al. | |
| 5,910,991 A | 6/1999 | Farrar | |
| 5,923,902 A | 7/1999 | Inagaki | |
| 6,032,202 A | 2/2000 | Lea et al. | |
| 6,111,957 A * | 8/2000 | Thomasson ............ H04R 29/00 381/103 |
| 6,256,554 B1 | 7/2001 | DiLorenzo | |
| 6,404,811 B1 | 6/2002 | Cvetko et al. | |
| 6,469,633 B1 | 10/2002 | Wachter | |
| 6,522,886 B1 | 2/2003 | Youngs et al. | |
| 6,573,067 B1 | 6/2003 | Dib-Hajj et al. | |
| 6,611,537 B1 | 8/2003 | Edens et al. | |
| 6,631,410 B1 | 10/2003 | Kowalski et al. | |
| 6,639,989 B1 | 10/2003 | Zacharov et al. | |
| 6,643,744 B1 | 11/2003 | Cheng | |
| 6,704,421 B1 | 3/2004 | Kitamura | |
| 6,721,428 B1 | 4/2004 | Allred et al. | |
| 6,757,517 B2 | 6/2004 | Chang | |
| 6,766,025 B1 | 7/2004 | Levy et al. | |
| 6,778,869 B2 | 8/2004 | Champion | |
| 6,798,889 B1 | 9/2004 | Dicker et al. | |
| 6,862,440 B2 | 3/2005 | Sampath | |
| 6,916,980 B2 | 7/2005 | Ishida et al. | |
| 6,931,134 B1 | 8/2005 | Waller, Jr. et al. | |
| 6,985,694 B1 | 1/2006 | De Bonet et al. | |
| 6,990,211 B2 | 1/2006 | Parker | |
| 7,039,212 B2 | 5/2006 | Poling et al. | |
| 7,058,186 B2 | 6/2006 | Tanaka | |
| 7,072,477 B1 | 7/2006 | Kincaid | |
| 7,103,187 B1 | 9/2006 | Neuman | |
| 7,130,608 B2 | 10/2006 | Hollstrom et al. | |
| 7,130,616 B2 | 10/2006 | Janik | |
| 7,143,939 B2 | 12/2006 | Henzerling | |
| 7,187,947 B1 | 3/2007 | White et al. | |
| 7,236,773 B2 | 6/2007 | Thomas | |
| 7,289,637 B2 | 10/2007 | Montag et al. | |
| 7,295,548 B2 | 11/2007 | Blank et al. | |
| 7,312,785 B2 | 12/2007 | Tsuk et al. | |
| 7,477,751 B2 | 1/2009 | Lyon et al. | |
| 7,483,538 B2 | 1/2009 | McCarty et al. | |
| 7,483,540 B2 | 1/2009 | Rabinowitz et al. | |
| 7,489,784 B2 | 2/2009 | Yoshino | |
| 7,490,044 B2 | 2/2009 | Kulkarni | |
| 7,492,909 B2 | 2/2009 | Carter et al. | |
| 7,519,188 B2 | 4/2009 | Berardi et al. | |
| 7,529,377 B2 | 5/2009 | Nackvi et al. | |
| 7,571,014 B1 | 8/2009 | Lambourne et al. | |
| 7,590,772 B2 | 9/2009 | Marriott et al. | |
| 7,630,500 B1 | 12/2009 | Beckman et al. | |
| 7,630,501 B2 | 12/2009 | Blank et al. | |
| 7,643,894 B2 | 1/2010 | Braithwaite et al. | |
| 7,657,910 B1 | 2/2010 | McAulay et al. | |
| 7,664,276 B2 * | 2/2010 | McKee Cooper ...... G01S 11/14 333/28 R |
| 7,676,044 B2 | 3/2010 | Sasaki et al. | |
| 7,689,305 B2 | 3/2010 | Kreifeldt et al. | |
| 7,742,740 B2 | 6/2010 | Goldberg et al. | |
| 7,769,183 B2 | 8/2010 | Bharitkar et al. | |
| 7,796,068 B2 | 9/2010 | Raz et al. | |
| 7,835,689 B2 | 11/2010 | Goldberg et al. | |
| 7,853,341 B2 | 12/2010 | McCarty et al. | |
| 7,925,203 B2 | 4/2011 | Lane et al. | |
| 7,949,140 B2 | 5/2011 | Kino | |
| 7,949,707 B2 | 5/2011 | McDowall et al. | |
| 7,961,893 B2 * | 6/2011 | Kino ....................... H04S 7/301 381/26 |
| 7,987,294 B2 | 7/2011 | Bryce et al. | |
| 8,005,228 B2 | 8/2011 | Bharitkar et al. | |
| 8,014,423 B2 | 9/2011 | Thaler et al. | |
| 8,045,721 B2 | 10/2011 | Burgan et al. | |
| 8,045,952 B2 | 10/2011 | Qureshey et al. | |
| 8,050,652 B2 | 11/2011 | Qureshey et al. | |
| 8,063,698 B2 | 11/2011 | Howard | |
| 8,074,253 B1 | 12/2011 | Nathan | |
| 8,103,009 B2 | 1/2012 | McCarty et al. | |
| 8,116,476 B2 | 2/2012 | Inohara | |
| 8,126,172 B2 | 2/2012 | Horbach et al. | |
| 8,131,390 B2 | 3/2012 | Braithwaite et al. | |
| 8,139,774 B2 | 3/2012 | Berardi et al. | |
| 8,144,883 B2 | 3/2012 | Pedersen et al. | |
| 8,160,276 B2 | 4/2012 | Liao et al. | |
| 8,160,281 B2 | 4/2012 | Kim et al. | |
| 8,170,260 B2 | 5/2012 | Reining et al. | |
| 8,175,292 B2 | 5/2012 | Aylward et al. | |
| 8,175,297 B1 | 5/2012 | Ho et al. | |
| 8,194,874 B2 | 6/2012 | Starobin et al. | |
| 8,229,125 B2 | 7/2012 | Short | |
| 8,233,632 B1 | 7/2012 | MacDonald et al. | |
| 8,234,395 B2 | 7/2012 | Millington | |
| 8,238,547 B2 | 8/2012 | Ohki et al. | |
| 8,238,578 B2 | 8/2012 | Aylward | |
| 8,243,961 B1 | 8/2012 | Morrill | |
| 8,265,310 B2 | 9/2012 | Berardi et al. | |
| 8,270,620 B2 | 9/2012 | Christensen | |
| 8,279,709 B2 | 10/2012 | Choisel et al. | |
| 8,281,001 B2 | 10/2012 | Busam et al. | |
| 8,290,185 B2 | 10/2012 | Kim | |
| 8,291,349 B1 | 10/2012 | Park et al. | |
| 8,300,845 B2 | 10/2012 | Zurek et al. | |
| 8,306,235 B2 | 11/2012 | Mahowald | |
| 8,325,931 B2 | 12/2012 | Howard et al. | |
| 8,325,935 B2 | 12/2012 | Rutschman | |
| 8,331,585 B2 | 12/2012 | Hagen et al. | |
| 8,332,414 B2 | 12/2012 | Nguyen et al. | |
| 8,379,876 B2 | 2/2013 | Zhang | |
| 8,391,501 B2 | 3/2013 | Khawand et al. | |
| 8,401,202 B2 | 3/2013 | Brooking | |
| 8,433,076 B2 | 4/2013 | Zurek et al. | |

(56) References Cited

U.S. PATENT DOCUMENTS

| | | | |
|---|---|---|---|
| 8,452,020 B2 | 5/2013 | Gregg et al. | |
| 8,463,184 B2 | 6/2013 | Dua | |
| 8,483,853 B1 | 7/2013 | Lambourne | |
| 8,488,799 B2 * | 7/2013 | Goldstein | G10L 19/00 381/122 |
| 8,503,669 B2 | 8/2013 | Mao | |
| 8,527,876 B2 | 9/2013 | Wood et al. | |
| 8,577,045 B2 | 11/2013 | Gibbs | |
| 8,577,048 B2 | 11/2013 | Chaikin et al. | |
| 8,600,075 B2 | 12/2013 | Lim | |
| 8,620,006 B2 | 12/2013 | Berardi et al. | |
| 8,731,206 B1 | 5/2014 | Park | |
| 8,755,538 B2 * | 6/2014 | Kwon | H04S 7/301 381/102 |
| 8,819,554 B2 | 8/2014 | Basso et al. | |
| 8,831,244 B2 | 9/2014 | Apfel | |
| 8,855,319 B2 | 10/2014 | Liu et al. | |
| 8,879,761 B2 | 11/2014 | Johnson et al. | |
| 8,903,526 B2 | 12/2014 | Beckhardt et al. | |
| 8,914,559 B2 | 12/2014 | Kalayjian et al. | |
| 8,930,005 B2 | 1/2015 | Reimann | |
| 8,934,647 B2 | 1/2015 | Joyce et al. | |
| 8,934,655 B2 | 1/2015 | Breen et al. | |
| 8,965,033 B2 | 2/2015 | Wiggins | |
| 8,965,546 B2 | 2/2015 | Visser et al. | |
| 8,977,974 B2 | 3/2015 | Kraut | |
| 8,984,442 B2 | 3/2015 | Pirnack et al. | |
| 8,989,406 B2 | 3/2015 | Wong et al. | |
| 8,995,687 B2 | 3/2015 | Marino, Jr. et al. | |
| 8,996,370 B2 | 3/2015 | Ansell | |
| 9,020,153 B2 | 4/2015 | Britt, Jr. | |
| 9,084,058 B2 | 7/2015 | Reilly et al. | |
| 9,100,766 B2 | 8/2015 | Soulodre | |
| 9,106,192 B2 | 8/2015 | Sheen et al. | |
| 9,215,545 B2 | 12/2015 | Dublin et al. | |
| 9,219,460 B2 | 12/2015 | Bush | |
| 9,231,545 B2 | 1/2016 | Agustin et al. | |
| 9,288,597 B2 | 3/2016 | Carlsson et al. | |
| 9,300,266 B2 | 3/2016 | Grokop | |
| 9,319,816 B1 | 4/2016 | Narayanan | |
| 9,467,779 B2 | 10/2016 | Iyengar et al. | |
| 9,472,201 B1 | 10/2016 | Sleator | |
| 9,489,948 B1 | 11/2016 | Chu et al. | |
| 9,538,308 B2 | 1/2017 | Isaac et al. | |
| 9,560,449 B2 | 1/2017 | Carlsson et al. | |
| 9,560,460 B2 | 1/2017 | Chaikin et al. | |
| 2001/0038702 A1 | 11/2001 | Lavoie et al. | |
| 2001/0042107 A1 | 11/2001 | Palm | |
| 2001/0043592 A1 | 11/2001 | Jimenez et al. | |
| 2002/0022453 A1 | 2/2002 | Balog et al. | |
| 2002/0026442 A1 | 2/2002 | Lipscomb et al. | |
| 2002/0078161 A1 | 6/2002 | Cheng | |
| 2002/0089529 A1 | 7/2002 | Robbin | |
| 2002/0124097 A1 | 9/2002 | Isely et al. | |
| 2003/0002689 A1 | 1/2003 | Folio | |
| 2003/0157951 A1 | 8/2003 | Hasty, Jr. | |
| 2003/0161479 A1 | 8/2003 | Yang et al. | |
| 2003/0179891 A1 | 9/2003 | Rabinowitz et al. | |
| 2004/0024478 A1 | 2/2004 | Hans et al. | |
| 2004/0237750 A1 | 12/2004 | Smith et al. | |
| 2005/0031143 A1 | 2/2005 | Devantier et al. | |
| 2005/0063554 A1 | 3/2005 | Devantier et al. | |
| 2005/0147261 A1 | 7/2005 | Yeh | |
| 2005/0157885 A1 | 7/2005 | Olney et al. | |
| 2006/0008256 A1 | 1/2006 | Khedouri et al. | |
| 2006/0026521 A1 | 2/2006 | Hotelling et al. | |
| 2006/0032357 A1 | 2/2006 | Roovers et al. | |
| 2006/0195480 A1 | 8/2006 | Spiegelman et al. | |
| 2006/0225097 A1 | 10/2006 | Lawrence-Apfelbaum | |
| 2007/0003067 A1 | 1/2007 | Gierl et al. | |
| 2007/0032895 A1 | 2/2007 | Nackvi et al. | |
| 2007/0038999 A1 | 2/2007 | Millington | |
| 2007/0086597 A1 | 4/2007 | Kino | |
| 2007/0121955 A1 | 5/2007 | Johnston et al. | |
| 2007/0142944 A1 | 6/2007 | Goldberg et al. | |
| 2008/0002839 A1 | 1/2008 | Eng | |
| 2008/0065247 A1 | 3/2008 | Igoe | |
| 2008/0069378 A1 | 3/2008 | Rabinowitz et al. | |
| 2008/0098027 A1 | 4/2008 | Aarts | |
| 2008/0136623 A1 | 6/2008 | Calvarese | |
| 2008/0144864 A1 | 6/2008 | Huon | |
| 2008/0175411 A1 | 7/2008 | Greve | |
| 2008/0266385 A1 | 10/2008 | Smith et al. | |
| 2009/0024662 A1 | 1/2009 | Park et al. | |
| 2009/0047993 A1 | 2/2009 | Vasa | |
| 2009/0063274 A1 | 3/2009 | Dublin, III et al. | |
| 2009/0110218 A1 | 4/2009 | Swain | |
| 2009/0138507 A1 | 5/2009 | Burckart et al. | |
| 2009/0147134 A1 | 6/2009 | Iwamatsu | |
| 2009/0196428 A1 | 8/2009 | Kim | |
| 2009/0252481 A1 | 10/2009 | Ekstrand | |
| 2009/0304205 A1 | 12/2009 | Hardacker et al. | |
| 2010/0128902 A1 | 5/2010 | Liu et al. | |
| 2010/0135501 A1 | 6/2010 | Corbett et al. | |
| 2010/0142735 A1 | 6/2010 | Yoon et al. | |
| 2010/0146445 A1 | 6/2010 | Kraut | |
| 2010/0162117 A1 | 6/2010 | Basso et al. | |
| 2010/0195846 A1 | 8/2010 | Yokoyama | |
| 2010/0272270 A1 | 10/2010 | Chaikin et al. | |
| 2010/0296659 A1 | 11/2010 | Tanaka | |
| 2010/0323793 A1 | 12/2010 | Andall | |
| 2011/0007904 A1 | 1/2011 | Tomoda et al. | |
| 2011/0007905 A1 | 1/2011 | Sato et al. | |
| 2011/0087842 A1 | 4/2011 | Lu et al. | |
| 2011/0091055 A1 | 4/2011 | LeBlanc | |
| 2011/0170710 A1 | 7/2011 | Son | |
| 2011/0234480 A1 | 9/2011 | Fino et al. | |
| 2012/0051558 A1 | 3/2012 | Kim et al. | |
| 2012/0057724 A1 | 3/2012 | Rabinowitz et al. | |
| 2012/0093320 A1 | 4/2012 | Flaks et al. | |
| 2012/0127831 A1 | 5/2012 | Gicklhorn et al. | |
| 2012/0148075 A1 | 6/2012 | Goh et al. | |
| 2012/0183156 A1 | 7/2012 | Schlessinger et al. | |
| 2012/0243697 A1 | 9/2012 | Frye | |
| 2012/0263325 A1 | 10/2012 | Freeman et al. | |
| 2012/0268145 A1 | 10/2012 | Chandra et al. | |
| 2012/0269356 A1 | 10/2012 | Sheerin et al. | |
| 2012/0283593 A1 | 11/2012 | Searchfield et al. | |
| 2012/0288124 A1 | 11/2012 | Fejzo et al. | |
| 2013/0010970 A1 | 1/2013 | Hegarty et al. | |
| 2013/0028443 A1 | 1/2013 | Pance et al. | |
| 2013/0051572 A1 | 2/2013 | Goh et al. | |
| 2013/0066453 A1 | 3/2013 | Seefeldt | |
| 2013/0108055 A1 | 5/2013 | Hanna et al. | |
| 2013/0129122 A1 | 5/2013 | Johnson et al. | |
| 2013/0202131 A1 | 8/2013 | Kemmochi et al. | |
| 2013/0211843 A1 | 8/2013 | Clarkson | |
| 2013/0216071 A1 | 8/2013 | Maher et al. | |
| 2013/0223642 A1 | 8/2013 | Warren et al. | |
| 2013/0230175 A1 | 9/2013 | Bech et al. | |
| 2013/0259254 A1 | 10/2013 | Xiang et al. | |
| 2013/0279706 A1 | 10/2013 | Marti | |
| 2013/0305152 A1 | 11/2013 | Griffiths et al. | |
| 2013/0315405 A1 | 11/2013 | Kanishima et al. | |
| 2013/0329896 A1 | 12/2013 | Krishnaswamy et al. | |
| 2014/0003622 A1 | 1/2014 | Ikizyan et al. | |
| 2014/0003625 A1 | 1/2014 | Sheen et al. | |
| 2014/0003626 A1 | 1/2014 | Holman et al. | |
| 2014/0006587 A1 | 1/2014 | Kusano | |
| 2014/0016784 A1 | 1/2014 | Sen et al. | |
| 2014/0016786 A1 | 1/2014 | Sen | |
| 2014/0016802 A1 | 1/2014 | Sen | |
| 2014/0023196 A1 | 1/2014 | Xiang et al. | |
| 2014/0037097 A1 | 2/2014 | Labosco | |
| 2014/0064501 A1 | 3/2014 | Olsen et al. | |
| 2014/0079242 A1 | 3/2014 | Nguyen et al. | |
| 2014/0112481 A1 | 4/2014 | Li et al. | |
| 2014/0126730 A1 | 5/2014 | Crawley et al. | |
| 2014/0161265 A1 | 6/2014 | Chaikin et al. | |
| 2014/0192986 A1 | 7/2014 | Lee et al. | |
| 2014/0219456 A1 | 8/2014 | Morrell et al. | |
| 2014/0219483 A1 | 8/2014 | Hong | |
| 2014/0226823 A1 | 8/2014 | Sen et al. | |
| 2014/0242913 A1 | 8/2014 | Pang | |

(56) References Cited

U.S. PATENT DOCUMENTS

| | | |
|---|---|---|
| 2014/0267148 A1 | 9/2014 | Luna et al. |
| 2014/0270202 A1 | 9/2014 | Ivanov et al. |
| 2014/0270282 A1 | 9/2014 | Tammi et al. |
| 2014/0273859 A1 | 9/2014 | Luna et al. |
| 2014/0279889 A1 | 9/2014 | Luna |
| 2014/0285313 A1 | 9/2014 | Luna et al. |
| 2014/0286496 A1 | 9/2014 | Luna et al. |
| 2014/0294200 A1 | 10/2014 | Baumgarte et al. |
| 2014/0310269 A1 | 10/2014 | Zhang et al. |
| 2014/0321670 A1 | 10/2014 | Nystrom et al. |
| 2014/0323036 A1 | 10/2014 | Daley et al. |
| 2014/0341399 A1 | 11/2014 | Dusse et al. |
| 2014/0344689 A1 | 11/2014 | Scott et al. |
| 2014/0355768 A1 | 12/2014 | Sen et al. |
| 2014/0355794 A1 | 12/2014 | Morrell et al. |
| 2015/0011195 A1 | 1/2015 | Li |
| 2015/0016642 A1 | 1/2015 | Walsh et al. |
| 2015/0031287 A1 | 1/2015 | Pang et al. |
| 2015/0032844 A1 | 1/2015 | Tarr et al. |
| 2015/0036847 A1 | 2/2015 | Donaldson |
| 2015/0036848 A1 | 2/2015 | Donaldson |
| 2015/0043736 A1 | 2/2015 | Olsen et al. |
| 2015/0063610 A1 | 3/2015 | Mossner |
| 2015/0078586 A1 | 3/2015 | Ang et al. |
| 2015/0078596 A1 | 3/2015 | Sprogis |
| 2015/0100991 A1 | 4/2015 | Risberg et al. |
| 2015/0146886 A1 | 5/2015 | Baumgarte |
| 2015/0201274 A1 | 7/2015 | Ellner et al. |
| 2015/0208184 A1 | 7/2015 | Tan et al. |
| 2015/0229699 A1 | 8/2015 | Liu |
| 2015/0281866 A1 | 10/2015 | Williams et al. |
| 2015/0289064 A1 | 10/2015 | Jensen et al. |
| 2015/0382128 A1 | 12/2015 | Ridihalgh et al. |
| 2016/0007116 A1 | 1/2016 | Holman |
| 2016/0011846 A1 | 1/2016 | Sheen |
| 2016/0014509 A1 | 1/2016 | Hansson et al. |
| 2016/0014537 A1 | 1/2016 | Lehnert et al. |
| 2016/0021458 A1 | 1/2016 | Johnson et al. |
| 2016/0021473 A1 | 1/2016 | Riggi et al. |
| 2016/0029142 A1 | 1/2016 | Isaac |
| 2016/0037277 A1 | 2/2016 | Matsumoto et al. |
| 2016/0165297 A1 | 6/2016 | Jamal-Syed et al. |
| 2016/0330562 A1 | 11/2016 | Crockett |
| 2016/0366517 A1 | 12/2016 | Chandran et al. |

FOREIGN PATENT DOCUMENTS

| | | |
|---|---|---|
| EP | 1389853 A1 | 2/2004 |
| EP | 2043381 A2 | 4/2009 |
| EP | 1349427 B1 | 12/2009 |
| EP | 2161950 A2 | 3/2010 |
| EP | 2194471 A1 | 6/2010 |
| EP | 2197220 A2 | 6/2010 |
| EP | 2429155 A1 | 3/2012 |
| EP | 1825713 B1 | 10/2012 |
| EP | 2591617 B1 | 6/2014 |
| EP | 2835989 A2 | 2/2015 |
| EP | 2860992 A1 | 4/2015 |
| KR | 1020060116383 | 11/2006 |
| KR | 1020080011831 | 2/2008 |
| WO | 0153994 A2 | 7/2001 |
| WO | 0182650 | 11/2001 |
| WO | 03093950 A2 | 11/2003 |
| WO | 2004066673 A1 | 8/2004 |
| WO | 2007016465 A2 | 2/2007 |
| WO | 2013016500 A1 | 1/2013 |
| WO | 2015024881 A1 | 2/2015 |
| WO | 2015178950 A1 | 11/2015 |

OTHER PUBLICATIONS

Co-pending U.S. Appl. No. 14/481,522, filed Sep. 9, 2014.
Co-pending U.S. Appl. No. 14/696,014, filed Apr. 24, 2015.
Co-pending U.S. Appl. No. 14/696,366, filed Apr. 24, 2015.
Daddy, B., "Calibrating Your Audio with a Sound Pressure Level (SPL) Meter," Blue-ray.com, Feb. 22, 2008 Retrieved Oct. 10, 2014, 15 pages.
Final Office Action mailed on Dec. 18, 2014, issued in connection with U.S. Appl. No. 13/340,126, filed Dec. 29, 2011, 12 pages.
First Action Interview Pilot Program Pre-Interview Communication mailed on Oct. 7, 2015, issued in connection with U.S. Appl. No. 14/216,306, filed Mar. 17, 2014, 5 pages.
International Bureau, International Preliminary Report on Patentability, mailed on Sep. 24, 2015, issued in connection with International Application No. PCT/US2014/030560, filed on Mar. 17, 2014, 7 pages.
International Searching Authority, International Search Report and Written Opinion mailed on Jun. 5, 2015, issued in connection with International Application No. PCT/US2015/021000, filed Mar. 17, 2015, 12 pages.
International Searching Authority, International Search Report and Written Opinion mailed on Jun. 16, 2015, issued in connection with International Application No. PCT/US2015/020993, filed on Mar. 17, 2015, 11 pages.
International Searching Authority, International Search Report and Written Opinion mailed on Nov. 18, 2015, issued in connection with International Application No. PCT/US2015/048954, filed on Sep. 8, 2015, 11 pages.
Mulcahy, John, "Room EQ Wizard: Room Acoustics Software" REW 2014 Retrieved Oct. 10, 2014, 4 pages.
Non-Final Action mailed on Jan. 29, 2016, issued in connection with U.S. Appl. No. 14/481,511, filed Sep. 9, 2014, 10 pages.
Non-Final Office Action mailed on Jun. 2, 2014, issued in connection with U.S. Appl. No. 13/340,126, filed Dec. 29, 2011, 14 pages.
Non-Final Office Action mailed on Dec. 7, 2015, issued in connection with U.S. Appl. No. 14/921,762, filed Oct. 23, 2015, 5 pages.
Non-Final Office Action mailed on Oct. 14, 2015, issued in connection with U.S. Appl. No. 14/216,325, filed Mar. 17, 2014, 7 pages.
Notice of Allowance mailed on Dec. 7, 2015, issued in connection with U.S. Appl. No. 14/216,325, filed Mar. 17, 2014, 7 pages.
Notice of Allowance mailed on Mar. 11, 2015, issued in connection with U.S. Appl. No. 13/340,126, filed Dec. 29, 2011, 7 pages.
Notice of Allowance mailed on Oct. 29, 2015, issued in connection with U.S. Appl. No. 14/216,306, filed Mar. 17, 2014, 9 pages.
First Action Interview Pilot Program Pre-Interview Communication mailed on Feb. 16, 2016, issued in connection with U.S. Appl. No. 14/681,465, filed Apr. 8, 2015, 5 pages.
"AudioTron Quick Start Guide, Version 1.0", Voyetra Turtle Beach, Inc., Mar. 2001, 24 pages.
"AudioTron Reference Manual, Version 3.0", Voyetra Turtle Beach, Inc., May 2002, 70 pages.
"AudioTron Setup Guide, Version 3.0", Voyetra Turtle Beach, Inc., May 2002, 38 pages.
"Bluetooth. "Specification of the Bluetooth System: The ad hoc Scatternet for affordable and highly functional wireless connectivity" Core, Version 1.0 A, Jul. 26, 1999, 1068 pages".
"Bluetooth. "Specification of the Bluetooth System: Wireless connections made easy" Core, Version 1.0 B, Dec. 1, 1999, 1076 pages".
""Constellation Acoustic System: a revolutionary breakthrough in acoustical design" Meyer Sound Laboratories, Inc., 2012, 32 pages".
""Constellation Microphones," Meyer Sound Laboratories, Inc., 2013, 2 pages".
"Dell, Inc. "Dell Digital Audio Receiver: Reference Guide" Jun. 2000, 70 pages".
"Dell, Inc. "Start Here" Jun. 2000, 2 pages".
"Jo, J. et al., "Synchronized One-to-many Media Streaming with Adaptive Playout Control," Proceedings of SPIE, 2002, pp. 71-82, vol. 4861".
"Jones, Stephen. "Dell Digital Audio Receiver: Digital upgrade for your analog stereo" Analog Stereo. Jun. 24, 2000 retrieved Jun. 18, 2014, 2 pages".
"Louderback, Jim. "Affordable Audio Receiver Furnishes Homes With MP3" TechTV Vault. Jun. 28, 2000 retrieved Jul. 10, 2014, 2 pages".

US 9,749,744 B2
Page 5

(56) References Cited

OTHER PUBLICATIONS

Microsoft; Corporation., "Using Microsoft Outlook 2003", Cambridge College, 2003.
Motorola., "Simplefi, Wireless Digital Audio Receiver, Installation and User Guide", Dec. 31, 2001, 111 pages.
"Non-Final Office Action mailed on Nov. 21, 2014, issued in connection with U.S. Appl. No. 13/536,493, filed Jun. 28, 2012, 20 pages".
"Notice of Allowance mailed on Apr. 10, 2015, issued in connection with U.S. Appl. No. 13/536,493, filed Jun. 28, 2012, 8 pages".
"Palm, Inc. "Handbook for the Palm VII Handheld" May 2000, 311 pages".
"Presentations at WinHEC 2000" May 2000, 138 pages.
PRISMIQ; Inc., "PRISMIQ Media Player User Guide", 2003, 44 pages.
"Ross, Alex. "Wizards of Sound: Retouching acoustics, from the restaurant to the concert hall" The New Yorker, Feb. 23, 2015. Web. Feb. 26, 2015".
"UPnP; "Universal Plug and Play Device Architecture"; Jun. 8, 2000; version 1.0; Microsoft Corporation; pp. 1-54".
Non-Final Office Action mailed on Jun. 21, 2016, issued in connection with U.S. Appl. No. 14/678,248, filed Apr. 3, 2015, 10 pages.
Notice of Allowance mailed on Apr. 12, 2016, issued in connection with U.S. Appl. No. 14/681,465, filed Apr. 8, 2015, 13 pages.
Notice of Allowance mailed on Feb. 26, 2016, issued in connection with U.S. Appl. No. 14/921,762, filed Oct. 23, 2015, 7 pages.
Non-Final Office Action mailed on Sep. 12, 2016, issued in connection with U.S. Appl. No. 14/811,587, filed Jul. 28, 2015, 24 pages.
Notice of Allowance mailed on Sep. 12, 2016, issued in connection with U.S. Appl. No. 15/066,072, filed Mar. 10, 2016, 7 pages.
Notice of Allowance mailed on Jul. 26, 2016, issued in connection with U.S. Appl. No. 14/481,511, filed Sep. 9, 2014, 12 pages.
Non-Final Office Action mailed on Jul. 6, 2016, issued in connection with U.S. Appl. No. 15/070,160, filed Mar. 15, 2016, 6 pages.
Non-Final Office Action mailed on Jul. 7, 2016, issued in connection with U.S. Appl. No. 15/066,049, filed Mar. 10, 2016, 6 pages.
Non-Final Office Action mailed on Jul. 8, 2016, issued in connection with U.S. Appl. No. 15/066,072, filed Mar. 10, 2016, 6 pages.
Non-Final Office Action mailed on Jul. 20, 2016, issued in connection with U.S. Appl. No. 14/682,182, filed Apr. 9, 2015, 13 pages.
Non-Final Office Action mailed on Jul. 27, 2016, issued in connection with U.S. Appl. No. 14/696,014, filed Apr. 24, 2015, 11 pages.
Notice of Allowance mailed on Jun. 3, 2016, issued in connection with U.S. Appl. No. 14/921,799, filed Oct. 23, 2015, 8 pages.
Notice of Allowance mailed on Jun. 23, 2016, issued in connection with U.S. Appl. No. 14/921,781, filed Oct. 23, 2015, 8 pages.
International Searching Authority, International Search Report and Written Opinion mailed on Jul. 4, 2016, issued in connection with International Application No. PCT/US2016/028994, filed on Apr. 22, 2016, 12 pages.
International Searching Authority, International Search Report and Written Opinion mailed on Jul. 5, 2016, issued in connection with International Application No. PCT/US2016/028997, filed on Apr. 22, 2016, 13 pages.
"auEQ for the iPhone," Mar. 25, 2015, retrieved from the internet: URL:https://web.archive.org/web20150325152629/http://www.hotto.de/mobileapps/iphoneaueq.html [retrieved on Jun. 24, 2016], 6 pages.
International Searching Authority, International Preliminary Report on Patentability dated Sep. 29, 2016, issued in connection with International Application No. PCT/US2015/020993, filed Mar. 17, 2015, 8 pages.
Final Office Action dated Oct. 14, 2016, issued in connection with U.S. Appl. No. 14/682,182, filed Apr. 9, 2015, 16 pages.
Final Office Action dated Oct. 17, 2016, issued in connection with U.S. Appl. No. 14/678,248, filed Apr. 3, 2015, 22 pages.
Final Office Action dated Oct. 21, 2016, issued in connection with U.S. Appl. No. 14/696,014, filed Apr. 24, 2015, 13 pages.

Non-Final Office Action dated Nov. 4, 2016, issued in connection with U.S. Appl. No. 14/826,856, filed Aug. 14, 2015, 10 pages.
Non-Final Office Action dated Oct. 6, 2016, issued in connection with U.S. Appl. No. 14/678,263, filed Apr. 3, 2015, 30 pages.
Non-Final Office Action dated Sep. 7, 2016, issued in connection with U.S. Appl. No. 14/826,873, filed Aug. 14, 2015, 12 pages.
Non-Final Office Action dated Oct. 25, 2016, issued in connection with U.S. Appl. No. 14/864,506, filed Sep. 24, 2015, 9 pages.
Notice of Allowance dated Nov. 9, 2016, issued in connection with U.S. Appl. No. 14/805,340, filed Jul. 21, 2015, 13 pages.
Notice of Allowance dated Sep. 16, 2016, issued in connection with U.S. Appl. No. 15/066,049, filed Mar. 10, 2016, 7 pages.
Notice of Allowance dated Aug. 19, 2016, issued in connection with U.S. Appl. No. 14/644,136, filed Mar. 10, 2015, 12 pages.
Notice of Allowance dated Sep. 23, 2016, issued in connection with U.S. Appl. No. 15/070,160, filed Mar. 15, 2016, 7 pages.
Notice of Allowance dated Oct. 25, 2016, issued in connection with U.S. Appl. No. 14/826,873, filed Aug. 14, 2015, 5 pages.
Notice of Allowance dated Oct. 26, 2016, issued in connection with U.S. Appl. No. 14/811,587, filed Jul. 28, 2015, 11 pages.
Preinterview First Office Action dated Oct. 6, 2016, issued in connection with U.S. Appl. No. 14/726,921, filed Jun. 1, 2015, 6 pages.
Supplemental Notice of Allowability dated Oct. 27, 2016, issued in connection with U.S. Appl. No. 14/481,511, filed on Sep. 9, 2014, 6 pages.
Gonzalez et al., "Simultaneous Measurement of Multichannel Acoustic Systems", J. Audio Eng. Soc., 2004, 52(1/2), 26-42.
International Searching Authority, International Preliminary Report on Patentability dated Sep. 29, 2016, issued in connection with International Application No. PCT/US2015/020993, filed on Mar. 17, 2015, 8 pages.
International Searching Authority, International Preliminary Report on Patentability dated Sep. 29, 2016, issued in connection with International Application No. PCT/US2015/021000, filed on Mar. 17, 2015, 9 pages.
International Searching Authority, International Search Report and Written Opinion dated Oct. 18, 2016, issued in connection with International Application No. PCT/US2016/043116, filed on Jul. 20, 2016, 14 pages.
International Searching Authority, International Search Report and Written Opinion dated Oct. 18, 2016, issued in connection with International Application No. PCT/US2016/043840, filed on Jul. 25, 2016, 14 pages.
International Searching Authority, International Search Report and Written Opinion dated Oct. 25, 2016, issued in connection with International Application No. PCT/US2016/043109, filed on Jul. 20, 2016, 12 pages.
Notice of Allowance dated on Sep. 16, 2016, issued in connection with U.S. Appl. No. 15/066,049, filed Mar. 10, 2016, 7 pages.
Notice of Allowance dated, Aug. 19, 2016, issued in connection with U.S. Appl. No. 14/644,136, filed Mar. 10, 2015, 12 pages.
Supplemental Notice of Allowability dated Oct. 27, 2016, issued in connection with U.S. Appl. No. 14/481,511, filed Sep. 9, 2014, 6 pages.
Corrected Notice of Allowability dated Jan. 19, 2017, issued in connection with U.S. Appl. No. 14/826,873, filed Aug. 14, 2015, 11 pages.
"Denon 2003-2004 Product Catalog," Denon, 2003-2004, 44 pages.
European Patent Office, Extended European Search Report dated Jan. 5, 2017, issued in connection with European Patent Application No. 15765555.6, 8 pages.
European Patent Office, Office Action dated Dec. 15, 2016, issued in connection with European Application No. 15766998.7, 7 pages.
Final Office Action dated Jan. 19, 2017, issued in connection with U.S. Appl. No. 14/940,779, filed Nov. 13, 2015, 15 pages.
First Action Interview Office Action dated Mar. 3, 2017, issued in connection with U.S. Appl. No. 14/726,921, filed Jun. 1, 2015, 9 pages.
First Action Interview Office Action dated Jul. 12, 2016, issued in connection with U.S. Appl. No. 14/481,514, filed Sep. 9, 2014, 10 pages.

(56) References Cited

OTHER PUBLICATIONS

First Action Interview Office Action dated Jun. 30, 2016, issued in connection with U.S. Appl. No. 14/481,505, filed Sep. 9, 2014, 9 pages.
International Searching Authority, International Search Report and Written Opinion dated Oct. 12, 2016, issued in connection with International Application No. PCT/US2016/041179 filed Jul. 6, 2016, 9 pages.
International Searching Authority, International Search Report and Written Opinion dated Nov. 23, 2015, issued in connection with International Application No. PCT/US2015/048942, filed Sep. 8, 2015, 14 pages.
International Searching Authority, International Search Report and Written Opinion dated Nov. 23, 2015, issued in connection with International Application No. PCT/US2015/048944, filed Sep. 8, 2015, 12 pages.
International Searching Authority, International Search Report and Written Opinion dated Nov. 23, 2016, issued in connection with International Patent Application No. PCT/US2016/052266, filed Sep. 16, 2016, 11 pages.
Non-Final Office Action dated Mar. 1, 2017, issued in connection with U.S. Appl. No. 15/344,069, filed Nov. 4, 2016, 20 pages.
Non-Final Office Action dated Feb. 3, 2016, issued in connection with U.S. Appl. No. 14/481,522, filed Sep. 9, 2014, 12 pages.
Non-Final Office Action dated Jan. 4, 2017, issued in connection with U.S. Appl. No. 15/207,682, filed Jul. 12, 2016, 6 pages.
Non-Final Office Action dated Dec. 9, 2016, issued in connection with U.S. Appl. No. 14/678,248, filed Apr. 3, 2015, 22 pages.
Non-Final Office Action dated Jul. 13, 2016, issued in connection with U.S. Appl. No. 14/940,779, filed Nov. 13, 2015, 16 pages.
Non-Final Office Action dated Dec. 14, 2016, issued in connection with U.S. Appl. No. 14/481,505, filed Sep. 9, 2014, 19 pages.
Non-Final Office Action dated Feb. 18, 2016, issued in connection with U.S. Appl. No. 14/644,136, filed Mar. 10, 2015, 10 pages.
Notice of Allowance dated Nov. 4, 2016, issued in connection with U.S. Appl. No. 14/481,514, filed Sep. 9, 2014, 10 pages.
Notice of Allowance dated Dec. 12, 2016, issued in connection with U.S. Appl. No. 14/805,140, filed Jul. 21, 2015, 24 pages.
Notice of Allowance dated Feb. 13, 2017, issued in connection with U.S. Appl. No. 14/864,506, filed Sep. 24, 2015, 8 pages.
Notice of Allowance dated Dec. 21, 2016, issued in connection with U.S. Appl. No. 14/682,182, filed Apr. 9, 2015, 8 pages.
Notice of Allowance dated Feb. 27, 2017, issued in connection with U.S. Appl. No. 14/805,340, filed Jul. 21, 2015, 9 pages.
Notice of Allowance dated Jul. 29, 2016, issued in connection with U.S. Appl. No. 14/481,522, filed Sep. 9, 2014, 11 pages.
Notice of Allowance dated Dec. 30, 2016, issued in connection with U.S. Appl. No. 14/696,014, filed Apr. 24, 2015, 13 pages.
Notice of Allowance dated Jan. 30, 2017, issued in connection with U.S. Appl. No. 15/339,260, filed Oct. 31, 2016, 8 pages.
Preinterview First Office Action dated May 17, 2016, issued in connection with U.S. Appl. No. 14/481,505, filed Sep. 9, 2014, 7 pages.
Preinterview First Office Action dated May 25, 2016, issued in connection with U.S. Appl. No. 14/481,514, filed Sep. 9, 2014, 7 pages.
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2003, entitled "Controlling and manipulating groupings in a multi-zone music or media system," 82 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

* cited by examiner

PLAYBACK DEVICE CALIBRATION

CROSS REFERENCE TO RELATED APPLICATIONS

This application is a continuation of U.S. non-provisional patent application Ser. No. 14/682,182, filed on Apr. 9, 2015, entitled "Calibration of Multiple Playback Devices," which is incorporated herein by reference in its entirety. U.S. non-provisional patent application Ser. No. 14/682,182 is a continuation of U.S. non-provisional patent application Ser. No. 13/536,493, entitled "System and Method for Device Playback Calibration" filed on Jun. 28, 2012 and issued on Aug. 11, 2015 as U.S. Pat. No. 9,106,192, which is incorporated herein by reference in its entirety.

FIELD OF THE DISCLOSURE

The disclosure is related to consumer goods and, more particularly, to systems, products, features, services, and other items directed to media playback or some aspect thereof.

BACKGROUND

Technological advancements have increased the accessibility of music content, as well as other types of media, such as television content, movies, and interactive content. For example, a user can access audio, video, or both audio and video content over the internet through an online store, an internet radio station, a music service, a movie service, and so on, in addition to the more traditional avenues of accessing audio and video content. Beyond the increased accessibility of music content, demand for high quality rendering of music content for the user to enjoy anytime, everywhere has also increased.

BRIEF DESCRIPTION OF THE DRAWINGS

Features, aspects, and advantages of the presently disclosed technology are better understood with regard to the following description, appended claims, and accompanying drawings where:

Figure 1A:
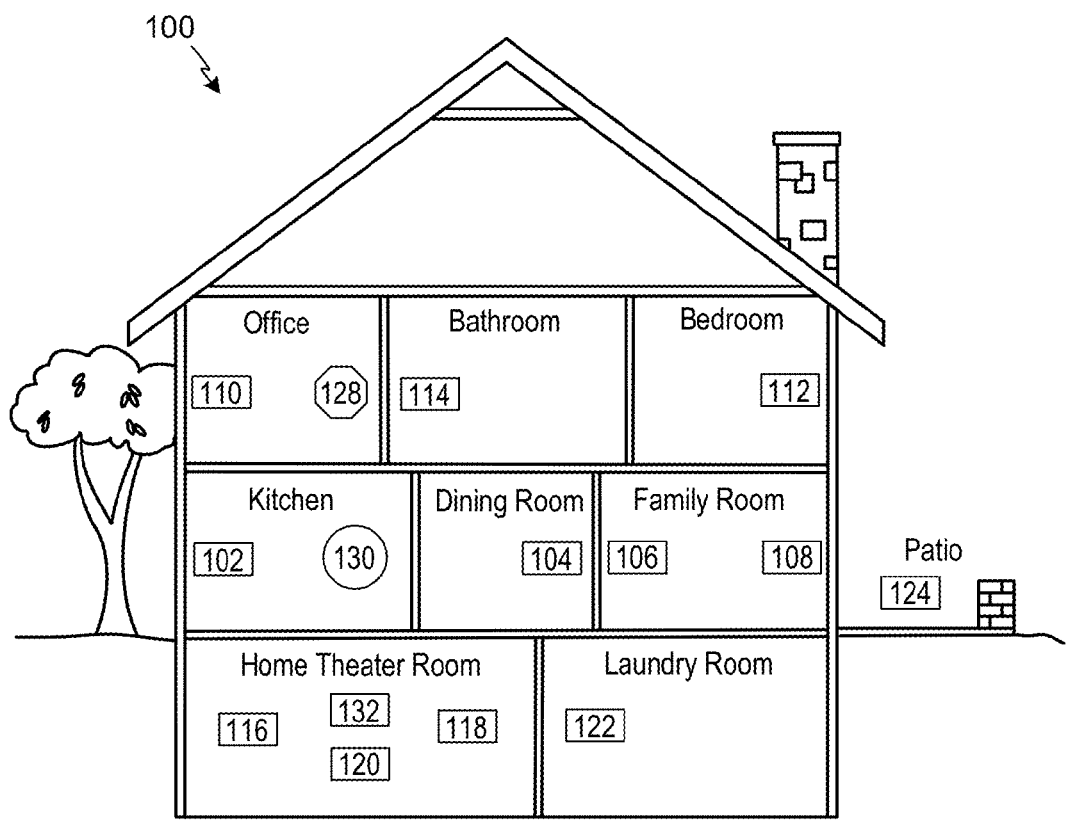
FIG. 1A shows an illustration of an example system in which embodiments of the methods and apparatus disclosed herein can be implemented.

In addition, the drawings are for the purpose of illustrating example embodiments, but it is understood that the present disclosure is not limited to the arrangements and instrumentality shown in the drawings.

DETAILED DESCRIPTION

I. Overview

Listening to audio content (e.g., music, talk radio, books, the audio from television, etc.) out loud may be a social activity that involves family, friends, or both. For example, in a household, people may play music out loud at parties and other social gatherings. In such an environment, people may wish to play the music in multiple listening zones simultaneously, such that the music in each listening zone may be synchronized, without audible echoes or glitches. Such an experience may be further enriched when people may browse audio sources, add a music track to a playback queue, learn more about a music track (such as track title or track artists), or view what music track is next in the playback queue. Listening to audio content out loud may also be an individual experience. For example, an individual may play music out loud for themselves in the morning before work, in the evening during dinner, or at other times throughout the day at home, work, or on the road. For these individual experiences, the individual may choose to either use headphones, or limit the out loud playback of audio content to a single zone or area.

In the case the user is listening to audio content out loud, the performance of an audio system may noticeably depend on an acoustic behavior of a room or area. As such, within each listening zone, the listening experience of the user may be further enriched by adjusting playback volumes and equalizations such that the listening experience is optimized at certain locations within the listening zone. For instance, in a home theater listening zone, the audio playback may be optimized specifically for people sitting on couch in front of a television and enjoying a movie. In another instance, in a porch or backyard listening zone, the audio playback may be optimized such that everyone in the vicinity may enjoy a comparable listening experience.

In one case, such a system may include audio players, often referred to as zone players or players, and controllers, which may also be a player. The controllers may be used to control the system, and may include capabilities for browsing and selecting audio content for playback, viewing and editing audio content in one or more playback queues, or grouping and ungrouping zone players into one or more listening zones, etc. In a sense, the system may operate as a distributed system such that each controller has full control over the entire system, and each player has the ability to play audio content from the either a same audio source or a different audio source as another player. The controllers may further be configured to operate as a calibration device for the system.

In an example embodiment of the present application, a system is provided. The system includes at least one playback device rendering audio content, a microphone configured to detect the rendered audio content from a first location relative to the at least one playback device, a signal processor configured to modulate the detected audio content with a modulation signal having a modulation frequency, and a processing unit in communication with the at least one playback device and signal processor. The processing unit is configured to receive the modulated audio content, demodulate the modulated audio content, and determine an equalization setting for the at least one playback device to render audio content based on an analysis of the demodulated audio content.

In another example embodiment of the present application, a device for playback calibration of at least one playback device is provided. The device includes a microphone configured to detect audio content rendered by the at least one playback device, and a signal processor configured to modulate the detected audio content for transmission to a processing unit configured to determine an equalization setting for the at least one playback device.

In yet another example embodiment of the present application, a method is provided for determining a first distance and direction of a playback device, causing the playback device to render audio content, receiving a first modulated version of the rendered audio content, and determining an equalization setting of the playback device based on the first modulated version of the rendered audio content, and the first distance and direction of the playback device.

With device playback calibration implemented on the system, as described above, the system may provide optimized playback of audio content by playback devices, thereby enriching the listening experience of users.

II. An Example Operating Environment

Referring now to the drawings, in which like numerals can refer to like parts throughout the figures, FIG. 1A shows an example system environment 100 in which one or more embodiments disclosed herein can be practiced or implemented.

By way of illustration, system environment 100 represents a home presently configured with multiple zones, though the home could have been configured with only one zone. Each zone in the home, for example, may represent a different room or space, such as an office, bathroom, bedroom, kitchen, dining room, family room, home theater room, utility or laundry room, and patio. A single zone might also include multiple rooms if so configured. One or more of zone players 102-124 are shown in each respective zone of the home. A zone player 102-124, also referred to as a playback device, multimedia unit, speaker, player, and so on, provides audio, video, and/or audiovisual output. Controller 130 provides control to system environment 100. Controller 130 may be fixed to a zone, or alternatively, mobile such that it can be moved about the zones. System environment 100 may also include more than one controller 130. System environment 100 illustrates an example whole house audio system, though it is understood that the technology described herein is not limited to its particular place of application or to an expansive system like a whole house audio system environment 100 of FIG. 1A.

Figure 1B:
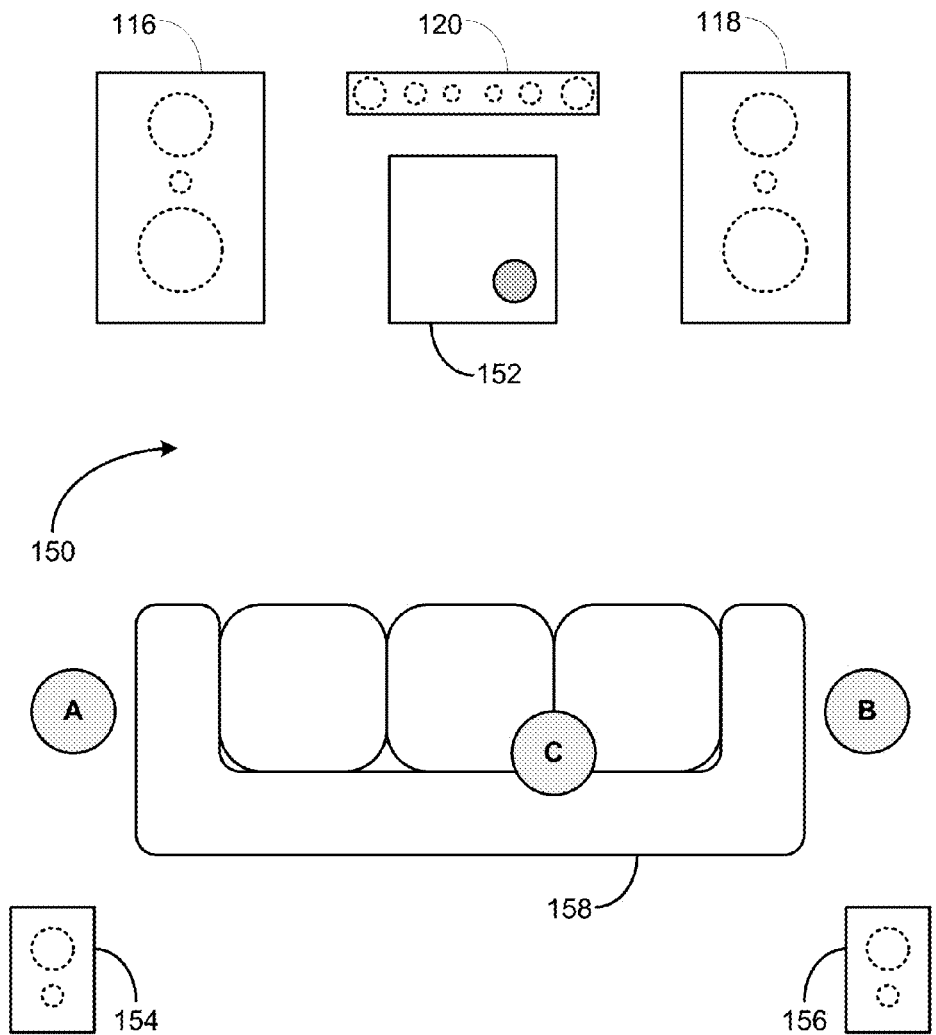
FIG. 1B shows an illustration of a second example system in which embodiments of the methods and apparatus disclosed herein can be implemented.

FIG. 1B shows an example home theater environment 150 including the zone players 116, 118, and 120 as shown in FIG. 1A. The example home theater environment 150 may further include zone players 152, 154, 156 and a couch 158.

As shown, the home theater environment 150 may be configured as a 5.1 surround sound system around a user sitting on the couch 158, such that zone player 116 may be configured to be the front left speaker, zone player 120 may be configured to be the center speaker, zone player 118 may be configured to be the front right speaker, zone player 154 may be configured to be the left rear speaker, zone player 156 may be configured to be the right rear speaker, and zone player 152 may be configured to be the low-frequency subwoofer.

A. Example Zone Players

Figure 2A:
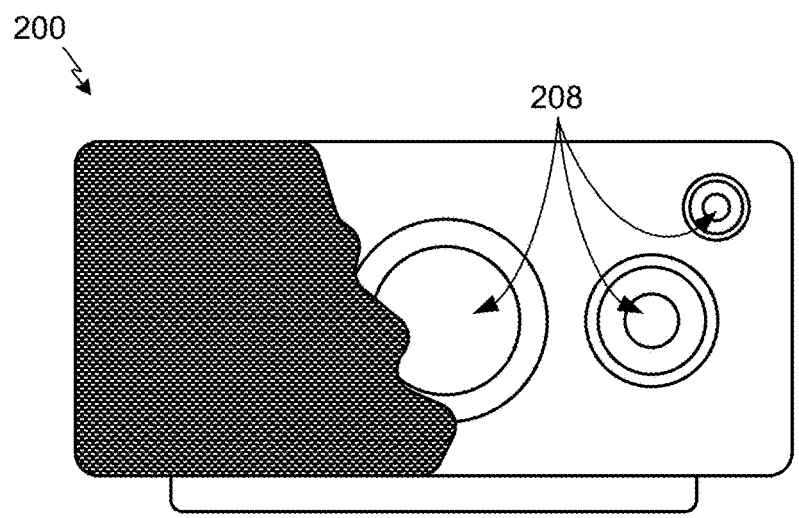
FIG. 2A shows an illustration of an example zone player having a built-in amplifier and speakers.
Figure 2B:
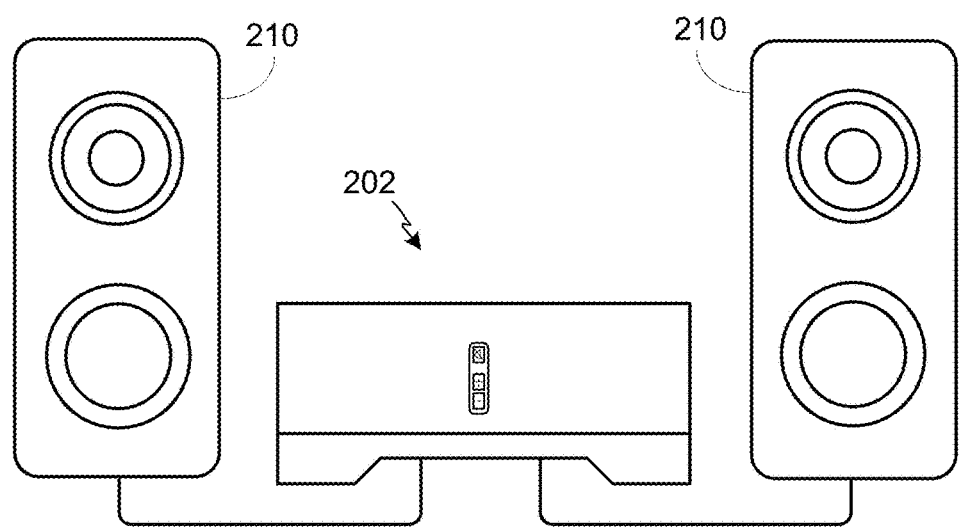
FIG. 2B shows an illustration of an example zone player having a built-in amplifier and connected to external speakers.
Figure 2C:
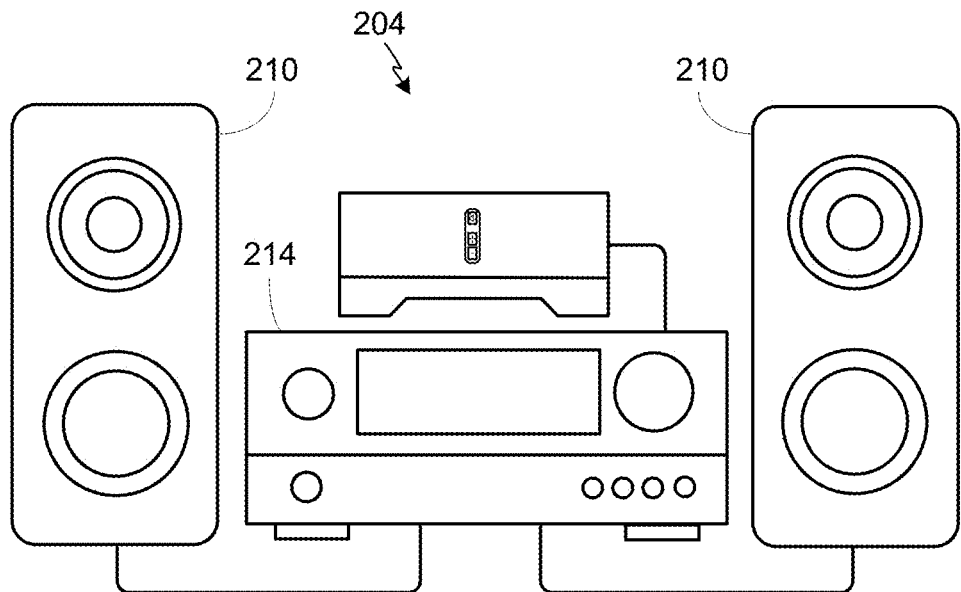
FIG. 2C shows an illustration of an example zone player connected to an A/V receiver and speakers.

FIGS. 2A, 2B, and 2C show example types of zone players. Zone players 200, 202, and 204 of FIGS. 2A, 2B, and 2C, respectively, can correspond to any of the zone players 102-124, and 152-156 of FIGS. 1A and 1B, for example. In some embodiments, audio is reproduced using only a single zone player, such as by a full-range player. In some embodiments, audio is reproduced using two or more zone players, such as by using a combination of full-range players or a combination of full-range and specialized players. In some embodiments, zone players 200-204 may also be referred to as a "smart speaker," because they contain processing capabilities beyond the reproduction of audio, more of which is described below.

FIG. 2A illustrates zone player 200 that includes sound producing equipment 208 capable of reproducing full-range sound. The sound may come from an audio signal that is received and processed by zone player 200 over a wired or wireless data network. Sound producing equipment 208 includes one or more built-in amplifiers and one or more speakers. A built-in amplifier is described more below with respect to FIG. 4. A speaker or acoustic transducer might include, for example, any of a tweeter, a mid-range driver, a low-range driver, and a subwoofer. In some embodiments, zone player 200 can be statically or dynamically configured to play stereophonic audio, monaural audio, or both. In some embodiments, zone player 200 is configured to reproduce a subset of full-range sound, such as when zone player 200 is grouped with other zone players to play stereophonic audio, monaural audio, and/or surround audio or when the audio content received by zone player 200 is less than full-range.

FIG. 2B illustrates zone player 202 that includes a built-in amplifier to power a set of detached speakers 210. A detached speaker can include, for example, any type of loudspeaker. Zone player 202 may be configured to power one, two, or more separate loudspeakers. Zone player 202 may be configured to communicate an audio signal (e.g., right and left channel audio or more channels depending on its configuration) to the detached speakers 210 via a wired path.

FIG. 2C illustrates zone player 204 that does not include a built-in amplifier, but is configured to communicate an audio signal, received over a data network, to an audio (or "audio/video") receiver 214 with built-in amplification.

Referring back to FIGS. 1A and 1B, in some embodiments, one, some, or all of the zone players 102-124, and 152-156 can retrieve audio directly from a source. For example, a zone player may contain a playlist or queue of audio items to be played. Each item in the queue may comprise a uniform resource identifier (URI) or some other identifier. The URI or identifier can point the zone player to the audio source. The source might be found on the internet (e.g., the cloud), locally from another device over data network 128, the controller 130, stored on the zone player itself, or from an audio source communicating directly to the zone player. In some embodiments, the zone player can reproduce the audio itself, send it to another zone player for reproduction, or both where the audio is played by the zone player and one or more additional zone players in synchrony. In some embodiments, the zone player can play a first audio content (or not play at all), while sending a second, different audio content to another zone player(s) for reproduction.

By way of illustration, SONOS, Inc. of Santa Barbara, Calif. presently offers for sale zone players referred to as a "PLAY:5," "PLAY:3," "CONNECT:AMP," "CONNECT," and "SUB." Any other past, present, and/or future zone players can additionally or alternatively be used to implement the zone players of example embodiments disclosed herein. Additionally, it is understood that a zone player is not limited to the particular examples illustrated in FIGS. 2A, 2B, and 2C or to the SONOS product offerings. For example, a zone player might consist of a wired or wireless headphone. In yet another example, a zone player might include a sound bar for television. In yet another example, a zone player can include or interact with a docking station for an Apple iPod™ or similar device.

B. Example Controllers

Figure 3:
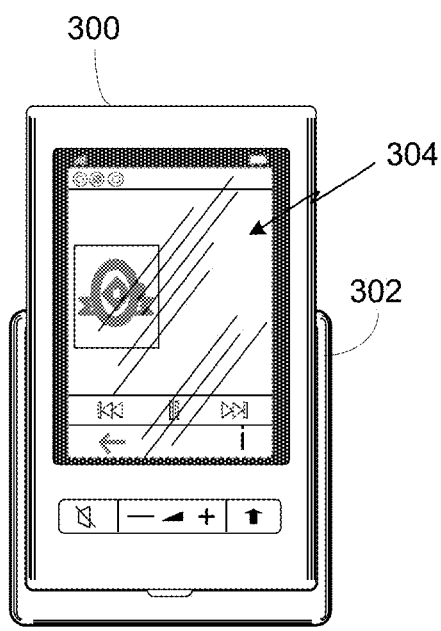
FIG. 3 shows an illustration of an example controller.

FIG. 3 illustrates an example wireless controller 300 in docking station 302. By way of illustration, controller 300 can correspond to controlling device 130 of FIG. 1A. Docking station 302, if provided, may be used to charge a battery of controller 300. In some embodiments, controller 300 is provided with a touch screen 304 that allows a user to interact through touch with the controller 300, for example, to retrieve and navigate a playlist of audio items, control operations of one or more zone players, and provide overall control of the system configuration 100. In certain embodiments, any number of controllers can be used to control the system configuration 100. In some embodiments, there can be a limit set on the number of controllers that can control the system configuration 100. The controllers might be wireless like wireless controller 300 or wired to data network 128.

In some embodiments, if more than one controller is used in system environment 100, then each controller may be coordinated to display common content, and may all be dynamically updated to indicate changes made from a single controller. Coordination might happen, for instance, by a controller periodically requesting a state variable directly or indirectly from one or more zone players; the state variable may provide information about system 100, such as current zone group configuration, what is playing in one or more zones, volume levels, and other items of interest. The state variable may be passed around on data network 128 between zone players (and controllers, if so desired) as needed or as often as programmed.

In addition, an application running on any network-enabled portable device, such as an iPhone™, iPad™, Android™ powered phone, or any other smart phone or network-enabled device can be used as controller 130. An application running on a laptop or desktop PC or Mac can also be used as controller 130. Such controllers may connect to system environment 100 through an interface with data network 128, a zone player, a wireless router, or using some other configured connection path. Example controllers offered by SONOS, Inc. of Santa Barbara, Calif. include a "Controller 200," "Sonos CONTROL," "Sonos® Controller for iPhone," "Sonos® Controller for iPad," "Sonos® Controller for Android, "Sonos® Controller for Mac or PC."

C. Example Data Connection

Zone players 102-124, and 152-156 of FIGS. 1A and 1B are coupled directly or indirectly to a data network, such as data network 128. Controller 130 may also be coupled directly or indirectly to data network 128 or individual zone players. Data network 128 is represented by an octagon in the figure to stand out from other representative components. While data network 128 is shown in a single location, it is understood that such a network is distributed in and around system 100. Particularly, data network 128 can be a wired network, a wireless network, or a combination of both wired and wireless networks. In some embodiments, one or more of the zone players 102-124, and 152-156 are wirelessly coupled to data network 128 based on a proprietary mesh network. In some embodiments, one or more of the zone players 102-124, and 152-156 are wirelessly coupled to data network 128 using a non-mesh topology. In some embodiments, one or more of the zone players 102-124, and 152-156 are coupled via a wire to data network 128 using Ethernet or similar technology. In addition to the one or more zone players 102-124, and 152-156 connecting to data network 128, data network 128 can further allow access to a wide area network, such as the internet.

In some embodiments, connecting any of the zone players 102-124, and 152-156 or some other connecting device, to a broadband router, can create data network 128. Other zone players 102-124, and 152-156 can then be added wired or wirelessly to the data network 128. For example, a zone player (e.g., any of zone players 102-124, and 152-156) can be added to the system environment 100 or home theater environment 150 by simply pressing a button on the zone player itself (or perform some other action), which enables a connection to be made to data network 128. The broadband router can be connected to an Internet Service Provider (ISP), for example. The broadband router can be used to form another data network within the system configuration 100, which can be used in other applications (e.g., web surfing). Data network 128 can also be used in other applications, if so programmed. An example, second network may implement SonosNet protocol, developed by SONOS, Inc. of Santa Barbara. SonosNet represents a secure, AES-encrypted, peer-to-peer wireless mesh network. Alternatively, in certain embodiments, the data network 128 is the same network, such as a traditional wired or wireless network, used for other applications in the household.

D. Example Zone Configurations

A particular zone can contain one or more zone players. For example, the family room of FIG. 1A contains two zone players 106 and 108, while the kitchen is shown with one zone player 102. In another example, the home theater room contains additional zone players to play audio from a 5.1 channel or greater audio source (e.g., a movie encoded with 5.1 or greater audio channels). In some embodiments, one can position a zone player in a room or space and assign the zone player to a new or existing zone via controller 130. As such, zones may be created, combined with another zone, removed, and given a specific name (e.g., "Kitchen"), if so desired and programmed to do so with controller 130. Moreover, in some embodiments, zone configurations may be dynamically changed even after being configured using controller 130 or some other mechanism.

In some embodiments, if a zone contains two or more zone players, such as the two zone players 106 and 108 in the family room, then the two zone players 106 and 108 can be configured to play the same audio source in synchrony, or the two zone players 106 and 108 can be paired to play two separate sounds in left and right channels, for example. In other words, the stereo effects of a sound can be reproduced or enhanced through the two zone players 106 and 108, one for the left sound and the other for the right sound. In certain embodiments, paired zone players (also referred to as "bonded zone players") can play audio in synchrony with other zone players in the same or different zones.

In some embodiments, two or more zone players can be sonically consolidated to form a single, consolidated zone player. A consolidated zone player (though made up of multiple, separate devices) can be configured to process and reproduce sound differently than an unconsolidated zone player or zone players that are paired, because a consolidated zone player will have additional speaker drivers from which sound can be passed. The consolidated zone player can further be paired with a single zone player or yet another consolidated zone player. Each playback device of a consolidated playback device is preferably set in a consolidated mode.

According to some embodiments, one can continue to do any of: group, consolidate, and pair zone players, for example, until a desired configuration is complete. The actions of grouping, consolidation, and pairing are preferably performed through a control interface, such as using controller 130, and not by physically connecting and re-connecting speaker wire, for example, to individual, discrete speakers to create different configurations. As such, certain embodiments described herein provide a more flexible and dynamic platform through which sound reproduction can be offered to the end-user.

E. Example Audio Sources

In some embodiments, each zone can play from the same audio source as another zone or each zone can play from a different audio source. For example, someone can be grilling on the patio and listening to jazz music via zone player 124, while someone is preparing food in the kitchen and listening to classical music via zone player 102. Further, someone can be in the office listening to the same jazz music via zone player 110 that is playing on the patio via zone player 124. In some embodiments, the jazz music played via zone players 110 and 124 is played in synchrony. Synchronizing playback amongst zones allows for someone to pass through zones while seamlessly (or substantially seamlessly) listening to the audio. Further, zones can be put into a "party mode" such that all associated zones will play audio in synchrony.

Sources of audio content to be played by zone players 102-124, and 152-156 are numerous. In some embodiments, music on a zone player itself may be accessed and a played. In some embodiments, music from a personal library stored on a computer or networked-attached storage (NAS) may be accessed via the data network 128 and played. In some embodiments, internet radio stations, shows, and podcasts can be accessed via the data network 128. Music or cloud services that let a user stream and/or download music and audio content can be accessed via the data network 128. Further, music can be obtained from traditional sources, such as a microphone, a turntable or CD player, via a line-in connection to a zone player, for example. Audio content can also be accessed using a different protocol, such as AirPlay™, which is a wireless technology by Apple, Inc., for example. Audio content received from one or more sources can be shared amongst the zone players 102-124, and 152-156 via data network 128 and/or controller 130. The above-disclosed sources of audio content are referred to herein as network-based audio information sources. However, network-based audio information sources are not limited thereto.

In some embodiments, the example home theater zone players 116, 118, 120 are coupled to an audio information source such as a television 132. In some examples, the television 132 is used as a source of audio for the home theater zone players 116, 118, 120, while in other examples audio information from the television 132 can be shared with any of the zone players 102-124 in the audio system 100.

III. Zone Players

Figure 4:
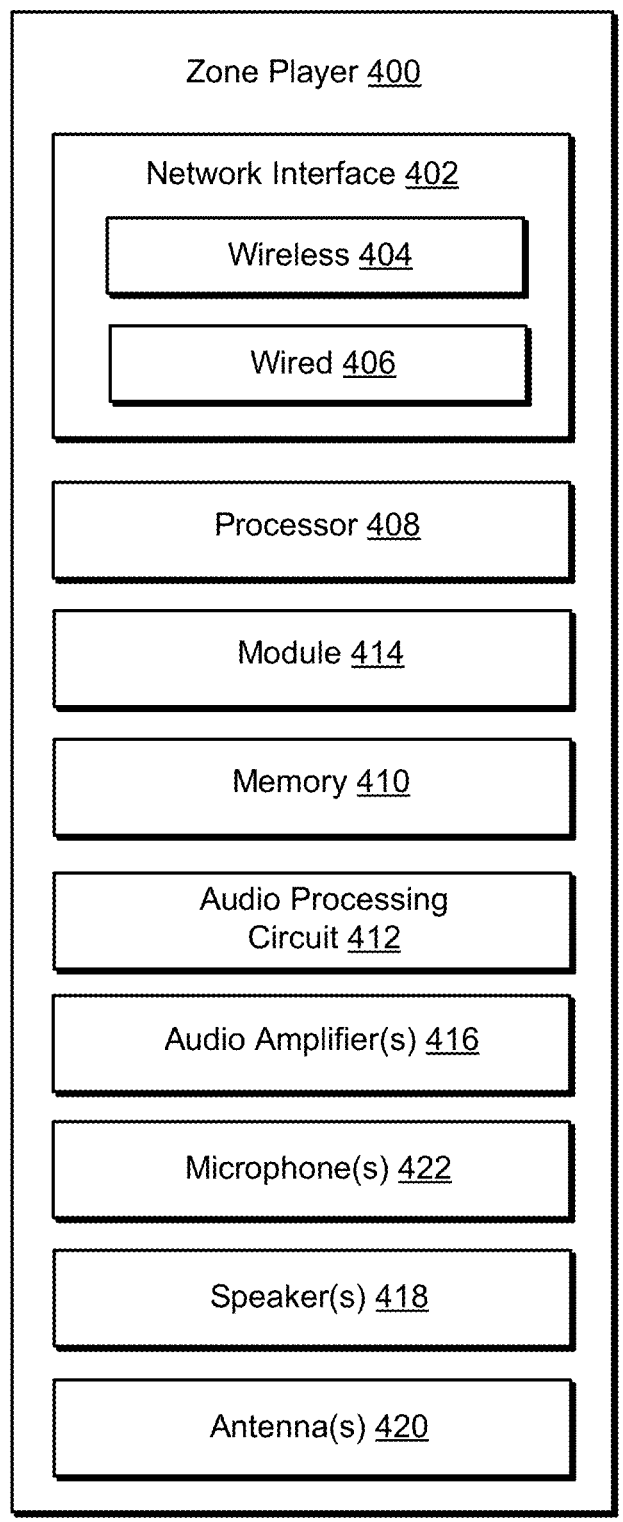
FIG. 4 shows an internal functional block diagram of an example zone player.

Referring now to FIG. 4, there is shown an example block diagram of a zone player 400 in accordance with an embodiment. Zone player 400 includes a network interface 402, a processor 408, a memory 410, an audio processing component 412, one or more modules 414, an audio amplifier 416, a microphone 422, and a speaker unit 418 coupled to the audio amplifier 416. FIG. 2A shows an example illustration of such a zone player. Other types of zone players may not include the speaker unit 418 (e.g., such as shown in FIG. 2B) or the audio amplifier 416 (e.g., such as shown in FIG. 2C). Further, it is contemplated that the zone player 400 can be integrated into another component. For example, the zone player 400 could be constructed as part of a television, lighting, or some other device for indoor or outdoor use.

In some embodiments, network interface 402 facilitates a data flow between zone player 400 and other devices on a data network 128. In some embodiments, in addition to getting audio from another zone player or device on data network 128, zone player 400 may access audio directly from the audio source, such as over a wide area network or on the local network. In some embodiments, the network interface 402 can further handle the address part of each packet so that it gets to the right destination or intercepts packets destined for the zone player 400. Accordingly, in certain embodiments, each of the packets includes an Internet Protocol (IP)-based source address as well as an IP-based destination address.

In some embodiments, network interface 402 can include one or both of a wireless interface 404 and a wired interface 406. The wireless interface 404, also referred to as an RF interface, provides network interface functions for the zone player 400 to wirelessly communicate with other devices (e.g., other zone player(s), speaker(s), receiver(s), component(s) associated with the data network 128, and so on) in accordance with a communication protocol (e.g., any of the wireless standards IEEE 802.11a, 802.11b, 802.11g, 802.11n, or 802.15). Wireless interface 404 may include one or more radios. To receive wireless signals and to provide the wireless signals to the wireless interface 404 and to transmit wireless signals, the zone player 400 includes one or more antennas 420. The wired interface 406 provides network interface functions for the zone player 400 to communicate over a wire with other devices in accordance with a communication protocol (e.g., IEEE 802.3). In some embodiments, a zone player includes both of the interfaces 404 and 406. In some embodiments, a zone player 400 includes only the wireless interface 404 or the wired interface 406.

In some embodiments, the processor 408 is a clock-driven electronic device that is configured to process input data according to instructions stored in memory 410. The memory 410 is data storage that can be loaded with one or more software module(s) 414, which can be executed by the processor 408 to achieve certain tasks. In the illustrated embodiment, the memory 410 is a tangible machine-readable medium storing instructions that can be executed by the processor 408. In some embodiments, a task might be for the zone player 400 to retrieve audio data from another zone player or a device on a network (e.g., using a URL or some other identifier). In some embodiments, a task might be for the zone player 400 to send audio data to another zone player or device on a network. In some embodiments, a task might be for the zone player 400 to synchronize playback of audio with one or more additional zone players. In some embodiments, a task might be to pair the zone player 400 with one or more zone players to create a multi-channel audio environment. Additional or alternative tasks can be achieved via the one or more software module(s) 414 and the processor 408.

The audio processing component 412 can include one or more digital-to-analog converters (DAC), an audio preprocessing component, an audio enhancement component or a digital signal processor, and so on. In some embodiments, the audio processing component 412 may be part of processor 408. In some embodiments, the audio that is retrieved via the network interface 402 or the microphone 422 is processed and/or intentionally altered by the audio processing component 412. Further, the audio processing component 412 can produce analog audio signals. The processed analog audio signals are then provided to the audio amplifier 416 for play back through speakers 418. In addition, the audio processing component 412 can include necessary circuitry to process analog or digital signals as inputs to play from zone player 400, send to another zone player on a network, or both play and send to another zone player on the network. An example input includes a line-in connection (e.g., an auto-detecting 3.5 mm audio line-in connection).

The audio amplifier 416 is a device(s) that amplifies audio signals to a level for driving one or more speakers 418. The one or more speakers 418 can include an individual transducer (e.g., a "driver") or a complete speaker system that includes an enclosure including one or more drivers. A particular driver can be a subwoofer (for low frequencies), a mid-range driver (middle frequencies), and a tweeter (high frequencies), for example. An enclosure can be sealed or ported, for example. Each transducer may be driven by its own individual amplifier.

A commercial example, presently known as the PLAY:5, is a zone player with a built-in amplifier and speakers that is capable of retrieving audio directly from the source, such as on the internet or on the local network, for example. In particular, the PLAY:5 is a five-amp, five-driver speaker system that includes two tweeters, two mid-range drivers, and one woofer. When playing audio content via the PLAY:5, the left audio data of a track is sent out of the left tweeter and left mid-range driver, the right audio data of a track is sent out of the right tweeter and the right mid-range driver, and mono bass is sent out of the subwoofer. Further, both mid-range drivers and both tweeters have the same equalization (or substantially the same equalization). That is, they are both sent the same frequencies, just from different channels of audio. Audio from internet radio stations, online music and video services, downloaded music, analog audio inputs, television, DVD, and so on, can be played from the PLAY:5.

IV. Controller

Figure 5:
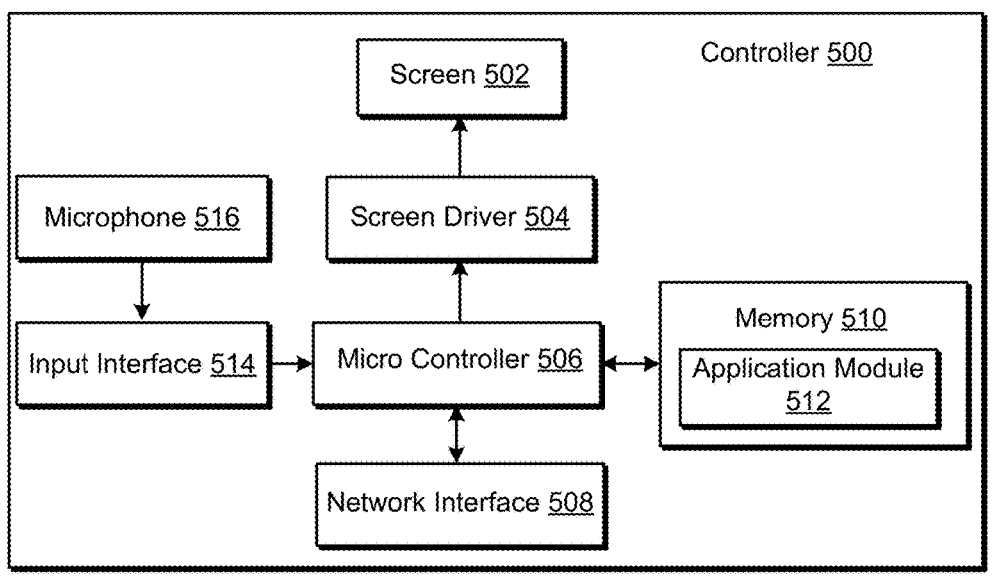
FIG. 5 shows an internal functional block diagram of an example controller.

Referring now to FIG. 5, there is shown an example block diagram for controller 500, which can correspond to the controlling device 130 in FIG. 1A. Controller 500 can be used to facilitate the control of multi-media applications, automation and others in a system. In particular, the controller 500 may be configured to facilitate a selection of a plurality of audio sources available on the network and enable control of one or more zone players (e.g., the zone players 102-124 in FIG. 1) through a wireless or wired network interface 508. According to one embodiment, the wireless communications is based on an industry standard (e.g., infrared, radio, wireless standards IEEE 802.11a, 802.11b 802.11g, 802.11n, or 802.15). Further, when a particular audio is being accessed via the controller 500 or being played via a zone player, a picture (e.g., album art) or any other data, associated with the audio and/or audio source can be transmitted from a zone player or other electronic device to controller 500 for display.

Controller 500 is provided with a screen 502 and an input interface 514 that allows a user to interact with the controller 500, for example, to navigate a playlist of many multimedia items and to control operations of one or more zone players. The input interface 514 may be coupled to a microphone 516 for capturing audio signals, such as audio content or voice commands as control inputs. The screen 502 on the controller 500 can be an LCD screen, for example. The screen 500 communicates with and is commanded by a screen driver 504 that is controlled by a microcontroller (e.g., a processor) 506. The memory 510 can be loaded with one or more application modules 512 that can be executed by the microcontroller 506 with or without a user input via the user interface 514 to achieve certain tasks. In some embodiments, an application module 512 is configured to facilitate grouping a number of selected zone players into a zone group and synchronizing the zone players for audio play back. In some embodiments, an application module 512 is configured to control the audio sounds (e.g., volume) of the zone players in a zone group. In operation, when the microcontroller 506 executes one or more of the application modules 512, the screen driver 504 generates control signals to drive the screen 502 to display an application specific user interface accordingly.

The controller 500 includes a network interface 508 that facilitates wired or wireless communication with a zone player. In some embodiments, the commands such as volume control and audio playback synchronization are sent via the network interface 508. In some embodiments, a saved zone group configuration is transmitted between a zone player and a controller via the network interface 508. The controller 500 can control one or more zone players, such as 102-124 of FIG. 1. There can be more than one controller for a particular system and each controller may share common information with another controller, or retrieve the common information from a zone player, if such a zone player stores configuration data (e.g., such as a state variable). Further, a controller can be integrated into a zone player.

It should be noted that other network-enabled devices such as an iPhone®, iPad® or any other smart phone or network-enabled device (e.g., a networked computer such as a PC or Mac®) can also be used as a controller to interact or control zone players in a particular environment. In some embodiments, a software application or upgrade can be downloaded onto a network-enabled device to perform the functions described herein.

In certain embodiments, a user can create a zone group (also referred to as a bonded zone) including at least two zone players from the controller 500. The zone players in the zone group can play audio in a synchronized fashion, such that all of the zone players in the zone group play back an identical audio source or a list of identical audio sources in a synchronized manner such that no (or substantially no) audible delays or hiccups could be heard. Similarly, in some embodiments, when a user increases the audio volume of the group from the controller 500, the signals or data of increasing the audio volume for the group are sent to one of the zone players and causes other zone players in the group to be increased together in volume.

A user via the controller 500 can group zone players into a zone group by activating a "Link Zones" or "Add Zone" soft button, or de-grouping a zone group by activating an "Unlink Zones" or "Drop Zone" button. For example, one mechanism for 'joining' zone players together for audio play back is to link a number of zone players together to form a group. To link a number of zone players together, a user can manually link each zone player or room one after the other. For example, assume that there is a multi-zone system that includes the following zones: Bathroom, Bedroom, Den, Dining Room, Family Room, and Foyer.

In certain embodiments, a user can link any number of the six zone players, for example, by starting with a single zone and then manually linking each zone to that zone.

In certain embodiments, a set of zones can be dynamically linked together using a command to create a zone scene or theme (subsequent to first creating the zone scene). For instance, a "Morning" zone scene command can link the Bedroom, Office, and Kitchen zones together in one action. Without this single command, the user would need to manually and individually link each zone. The single command might include a mouse click, a double mouse click, a button press, a gesture, or some other programmed action. Other kinds of zone scenes can be programmed.

In certain embodiments, a zone scene can be triggered based on time (e.g., an alarm clock function). For instance, a zone scene can be set to apply at 8:00 am. The system can link appropriate zones automatically, set specific music to play, and then stop the music after a defined duration. Although any particular zone can be triggered to an "On" or "Off" state based on time, for example, a zone scene enables any zone(s) linked to the scene to play a predefined audio (e.g., a favorable song, a predefined playlist) at a specific time and/or for a specific duration. If, for any reason, the scheduled music failed to be played (e.g., an empty playlist, no connection to a share, failed Universal Plug and Play (UPnP), no internet connection for an internet Radio station, and so on), a backup buzzer can be programmed to sound. The buzzer can include a sound file that is stored in a zone player, for example.

V. Playback Device Calibration

As mentioned above, the performance of an audio system may depend on the acoustic behaviors of a room or area in which the audio system is operating, and accordingly, the listening experience of a user may be further enriched by adjusting playback volumes and equalizations such that the listening experience is optimized at certain locations within the listening environment. In some audio systems, the user may be provided with varying degrees of control over the equalization (such as bass, treble, mid controls or subwoofer sub level controls) to achieve a desired equalization of the audio playback in the particular listening environment. As audio systems become more complex with more specialized speakers, the user may benefit from automatic or guided calibrations, after which the user may further adjust the settings to individual taste.

In one example, a calibration device with a microphone may be utilized for the automatic or guided calibrations of the audio system. In this case, the user may position the calibration device at different locations within a playback environment. At each of the positions, the audio system may render audio content for detection by the calibration device microphone at the location, and a computing device may be configured to then process the detected audio content and generate an optimized equalization setting for audio playback by the audio system playback in the playback environment. The calibration process using the calibration device with the microphone is discussed in further detail below in connection to FIG. 6.

Figure 6:
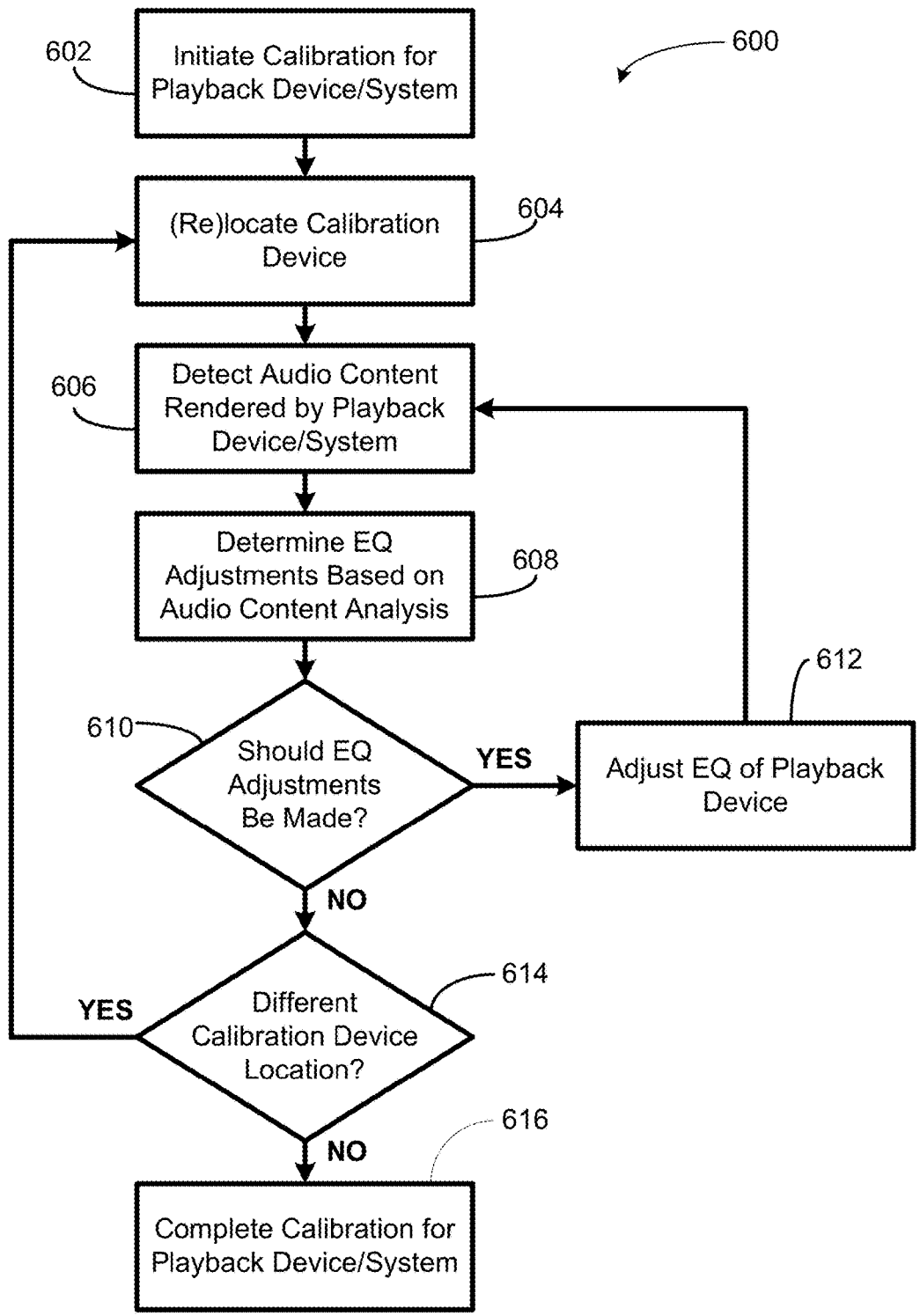
FIG. 6 shows an illustrative flow diagram of an example method for device playback calibration.

FIG. 6 shows an illustrative block diagram of an example method 600 for device playback calibration using a calibration device, in accordance with at least some embodiments described herein. Method 600 shown in FIG. 6 presents an embodiment of a method that could be used in the environments 100 and 150 with the systems 200, 202, 204, 300, 400, and 500 for example, in communication with a device, such as devices illustrated in FIGS. 2-5, components of the devices, or a calibration device described in a following section. Method 600 may include one or more operations, functions, or actions as illustrated by one or more of blocks 602-616. As shown, blocks 602-608, 612, and 616 may involve actions, and blocks 610, and 614 may involve decisions. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

In addition, for the method 600 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the method 600 and other processes and methods disclosed herein, each block in FIG. 6 may represent circuitry that is wired to perform the specific logical functions in the process.

At action block 602, the method 600 involves initiating calibration for a playback device or playback system. For purposes of illustration, a scenario may involve a user calibrating the audio system in the playback environment 150 shown in FIG. 1B. As shown, the audio system may include the left front channel speaker 116, the center channel speaker 120, the right front channel speaker 118, the rear left channel speaker 154, the rear right channel speaker 156, and the subwoofer 152. The playback environment as shown in FIG. 1B may also include the couch 158 where users may sit to enjoy a movie, and locations A, B, and C within the playback environment 150. In one example, calibration may be initiated for the entire audio system, a subgroup of playback devices in the system, such as front speakers 116, 118, and 120, or individual playback devices such as the subwoofer 152.

In one example, the user may initiate playback calibration via a controller, such as the controllers 130, 300, or 500 previously discussed. As mentioned above, the controller may be a smart phone, such as an iPhone™ or Android™ powered phone, or any other or network-enabled device, such as an iPad™. In another example, the controller may also be the calibration device with microphone discussed above. Further, due to a readily available user interface and processing capabilities, the smart phone or network-enabled device may also be configured to guide the user through the calibration process. For instance, a software application operating on a smart phone may provide a comprehensive calibration process, including prompting the user for necessary actions on the part of the user and providing audio content as test signals for detection. The smart phone may further be configured to perform the data processing and/or signal analysis on the detected audio content for playback calibration.

In one example, the device may prompt the user to initiate device calibration after each time the device or system has been disconnected, which may indicate that the device or system has relocated. In yet another example, the device may prompt the user to initiate device calibration after the user requests a change in preset equalization. For instance, the user may have previously selected a preset equalization for "Classical Music," and has selected to change the preset equalization to "Jazz." In this case, the user may be offered a choice between creating a new calibration setting for "Jazz" in the playback environment or having the system automatically adjust the equalization for "Jazz," based on a previous calibration performed for "Classical Music."

At action block 604, the method 600 involves locating or relocating the calibration device in the playback environment. In one example, the device calibration may be a guided process such that the user may be prompted to move the calibration device to a specific location within the playback environment. For example, referring to FIG. 1B, the calibration process may have been initiated to optimize the movie audio experience of viewers seated on the couch 158. In this example, the guided process may prompt the user to first locate the calibration device at location A, on the left end of the couch 158. In one case, various calibration processing steps may be performed while the calibration device is at location A, after which the user may be prompted to relocate the calibration device to location B, on the right end of the couch 158.

In another example, the user may be seated on the couch 158 at location C when initiating the calibration process. In one instance, the user may wish to calibrate the system to optimize the audio experience for someone sitting exactly where he/she is. In this instance, the calibration device may be configured to store the location of location C in the playback environment before proceeding with the playback calibration of the playback device or system.

At action block 606, the method 600 involves detecting audio content rendered by the playback device or system. In one example, the audio content rendered for playback calibration may be a favorite track selected by the user. In another example, the audio content may be a series of incremental frequencies spanning the audible frequency range. In one case, the audio content may be provided to the playback device by the calibration device.

In one case in which calibration was initiated for the entire audio system or a subgroup of playback devices in the system, each of the playback devices being calibrated may render audio content all at the same time for the calibration device microphone to detect from a predetermined location.

In one example, calibration for a subgroup of playback devices 116, 120, and 118 may involve each playback device rendering audio content at the same time. In another case in which calibration was initiated for the entire audio system or a subgroup of playback devices in the system, audio content may be rendered sequentially by each playback device being calibrated, such that the calibration microphone may detect individually audio content rendered by each individual playback device from the predetermined location. In one example, calibration for the subgroup of playback device 116, 120, and 118 may involve playback device 116 rendering audio content first, followed by playback device 120 rendering audio content upon completion of the rendering of audio content by playback device 116, and further followed by playback device 118 rendering audio content upon completion of the rendering of audio content by playback device 120. In one instance, each of the playback devices 116, 120, and 118 may render the same audio content to provide a consistent frequency response spectrum for analysis.

At action block 608, the method 600 involves determining equalization adjustments based on an analysis of the detected audio content. In one example, the analysis of the detected audio content may involve evaluating the frequency response spectrum of the detected audio content. The evaluation of the frequency response spectrum of the detected audio content may include consideration for the capabilities and specializations of the playback device rendering the detected audio content. For example, the frequency response spectrum of detected audio content rendered by the subwoofer 152 may include stronger low-frequency responses and weaker high-frequency responses.

In addition to the capabilities and specializations of the playback device rendering the detected audio content, the evaluation of the frequency response spectrum of the detected audio content may also include considerations for a distance and direction of the playback device from the calibration device. For example, if the calibration device is located at location A, the calibration may anticipate stronger signal strength represented in the frequency response spectrum of detected audio content rendered by playback device 116 than that of the frequency spectrum of detected audio content rendered by playback device 118 by virtue of playback device 116 being closer to the calibration device at location A than playback device 118.

Based on the analyses of the frequency responses of the detected audio content, corresponding equalization adjustments for each playback device being calibrated may be determined. The equalization adjustments may indicate specific frequencies that are to be amplified or attenuated when being rendered by the corresponding playback device, such that the audio content rendered by the corresponding playback device after the adjustments will have a frequency response spectrum substantially matching a desired frequency response spectrum. In one case, the desired frequency response spectrum may be representative of a preset equalization setting, such as "Jazz" or "Classical Music," as previously mentioned.

At decision block 610, the method 600 involves determining whether equalization adjustments should be made. As discussed above, the equalization adjustments may indicate frequency amplifications or attenuations by a corresponding playback device such that the frequency response spectrum of audio content rendered by the corresponding playback device will substantially match that of the desired frequency response spectrum. In one example, the determined equalization adjustments may indicate a number of frequencies or frequency ranges that are to be amplified, and another number of frequencies or frequency ranges that are to be attenuated. In this case, the method 600 may determine at decision block 610 that equalization adjustments are to be made, and may proceed to action block 612.

At action block 612, the method 600 involves adjusting the equalization settings of the one or more playback devices being calibrated. As previously discussed, a system or subgroup of playback device may be calibrated as a whole, or as individual playback devices. Accordingly, the adjustment of the equalization settings may be performed every time a playback device has rendered audio content for detection and analysis by the calibration device, or only after each playback device in the system or subgroup being calibrated has rendered audio content for detection and analysis.

In a further case, the equalization settings may be adjusted first individually, and then as a complete system or subgroup of playback devices. In other words, each playback device may first be calibrated independently, before fine-tuning of equalization settings for the playback devices in the system or subgroup as a whole, to account for potential acoustic interferences between the different playback devices in the system or subgroup.

Once the determined equalization adjustments have been made at the corresponding playback devices, the playback devices may render audio content for further detection and analysis as described before in reference to blocks 606, 608, and 610. The loop of blocks 606, 608, 610, and 612 may be continued until, at decision block 610, the method 600 determines that the frequency response spectrum of audio content rendered by the corresponding playback device substantially matches that of the desired frequency response, and accordingly that no further equalization adjustments are necessary. In this case, the method 600 may proceed to decision block 614.

At decision block 614, the method 600 involves determining whether the calibration device should be relocated to another location for further calibration. As discussed above, the calibration process may have been initiated to optimize the movie audio experience of viewers seated on the couch 158 of FIG. 1B. In this case, the calibration process may be performed at both location A, on the left side of the couch 158, and location B, on the right side of the couch 158. As such, upon completion of equalization adjustments of playback devices with the calibration device at location A, the method 600 may determine that audio content detection, frequency response spectrum analysis, and equalization adjustments still need to be performed with the calibration device at location B. In this case, the user may be prompted to relocate the calibration device to location B. In the case a smart phone is used as the calibration device, the user may be prompted via a user interface of the smart phone to relocate the calibration device. In another case, if only one calibration location is necessary, or once calibration steps have been performed at each of the calibration locations in the listening environment, then the calibration device does not need to be further relocated for calibration purposes. In this case, the method 600 may proceed to action block 616, where calibration is completed.

At action block 616, the method 600 involves completing the calibration process for the system, subgroup of playback devices, or individual playback device. In one case, the determined calibration settings for each calibrated playback device may be stored on the calibration device. In another case, the determined calibration settings for each calibrated playback device may be transmitted to each corresponding playback device for local storage. In one instance, the determined calibration settings may be transmitted to the playback device or system wirelessly according to a wireless communication protocol previously discussed.

In a real world application, the calibration process may take no longer than a few minutes and would not need to be repeated unless significant changes are made to the room arrangement. Further, as discussed previously, the calibration process is intended to provide the user with a good system equalization starting point, from which the user can make further manual adjustment according to personal preferences.

VI. Microphone Device for Playback Device Calibration

As discussed previously, a smart phone, such as an iPhone™ or Android™ powered phone, or any other or network-enabled device, such as an iPad™ may be utilized as a calibration device due to the available user interface and data processing capabilities. In many cases, the smart phone or network-enabled device may also include a built-in microphone which may be configured to detect audio content rendered for the purpose of playback calibrations. Further, as applied towards a SONOS system as previously discussed, smart phones may already be utilized as controllers, and as such may further be configured to be used as a calibration device with minimal hassle or inconvenience to a user. In the following discussion, the term "smart phone" will be used to represent any network-enabled device capable of being utilized as a controller for an audio system.

In one case, the performance of the playback calibration method discussed above may depend on the consistency of a frequency responses and frequency sensitivities of a microphone used to detect audio content for calibration purposes. In one case, consistency of frequency responses and sensitivities may allow the playback calibration process to accommodate for particular audio content detection characteristics of the microphone. For instance, for optimal playback calibration of low-mid frequency audio rendering by a playback device, consistent frequency responses within the range of around 30 Hz to 1 kHz may be beneficial. In another instance, a consistent frequency response within the range of around 30 Hz to beyond 10 kHz may benefit playback calibration of the full audible frequency range rendering by a playback device. In some cases, however, built-in microphones on smart phones do not have consistent frequency responses and sensitivities for optimal playback calibration.

In one example, a calibration microphone having consistent frequency response and sensitivities within the desires frequency range may be provided for playback calibration. In one example, the calibration microphone may be coupled to the smart phone via the audio input jack of the smart phone. Smart phones, however, may be generally optimized for speech, and may accordingly be configured to filter out frequencies below 200 Hz, thereby filtering out a portion of the low-frequency audio content which may constitute an important component of popular music, and for which playback calibration may be applicable. On the other hand, the frequency response range of the smart phone audio input jack may extend up to around 10 kHz. In the application of low-mid audio frequency calibration, this leaves the frequency range of around 1 kHz to around 10 kHz unused and available. In one case, one or more frequencies within this available range may be suitably utilized, as will be discussed below.

Figure 7B:
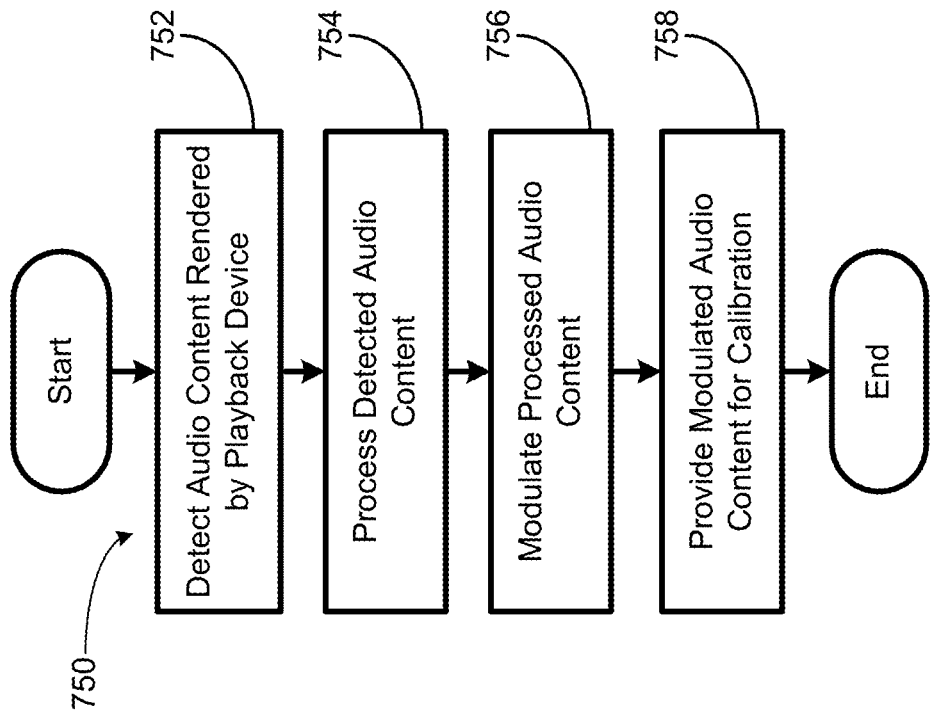
FIG. 7B shows an illustrative flow diagram of an example method for device playback calibration by an example calibration microphone.
Figure 7A:
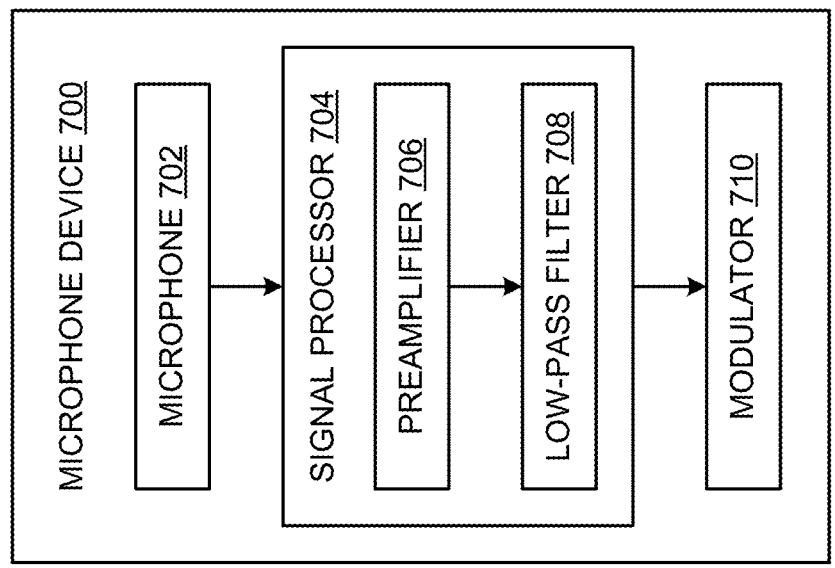
FIG. 7A shows an internal function block diagram of an example calibration microphone device.

FIG. 7A shows an illustrative block diagram of an example microphone device 700 which may be utilized as a calibration microphone when connected to a smart phone or controller as discussed above. As shown, the microphone device 700 includes a microphone 702, a signal processor 704, and a modulator 710.

In one example, the microphone 702 may be required to have a certain degree of frequency response and sensitivity consistency. In one case, as discussed above, the microphone 702 may be required to have a consistent frequency response within a range of 30 Hz to 1 kHz, such that audio content within the range of frequencies may be detected consistently.

FIG. 7B shows an illustrative flow diagram of an example method 750 for device playback calibration by an example calibration microphone device such as the microphone device 700 of FIG. 7A, in accordance with at least some embodiments described herein. As shown, method 750 presents an embodiment of a method that could be used in the environments 100 and 150 with the systems 200, 202, 204, 300, 400, and 500 for example, and performed by a device, such as the calibration device 700 shown in FIG. 7A. Method 750 may include one or more operations, functions, or actions as illustrated by one or more of blocks 752-758. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

At block 752, the method 750 involves detecting audio content rendered by the playback device being calibrated. Continuing with the example above relating to calibration of low-mid frequency range playback, the microphone 702 of the microphone device 700 may have a consistent, or at least predictable, frequency response within the frequency range of 30 Hz to 1 kHz. As such, the frequency components of the rendered audio content within the low-mid frequency range may be sufficiently detected by the microphone 702.

At block 754, the method 750 involves processing the detected audio content. Referring back to FIG. 7A, the signal processor 704 may be configured to receive the audio content detected by the microphone 702 and perform a degree of signal processing. In one case, the signal processor 704 may be configured to improve the signal-to-noise ratio of the detected audio content.

Also shown in FIG. 7A, the signal processor 704 may include a preamplifier 706 for amplifying the detected audio content and a low-pass filter 708 for removing high frequency noise components of the detected audio content, thereby improving the signal-to-noise ratio of the detected audio content. In one case, the detected audio content may include frequency components outside of the low-mid frequency range of 30 Hz to 1 kHz. In this case, the signal processor 704 may further be configured to filter out frequency components outside of the low-mid frequency range, as these frequency components may not be relevant for low-mid frequency playback calibration. Along similar lines, the low-pass filtering may also ensure that the frequency range between 1 kHz and 10 kHz remains unused, and available, as discussed above.

After the audio content has been detected by the microphone 702 and processed by the signal processor 704, the modulator 710 may be configured to modulate the audio content for output. As discussed previously, frequency response ranges for the audio input jacks of smart phones may be in the 200 Hz to 10 kHz range. Continuing with the low-mid frequency playback calibration example, the available frequency range of the audio input jack may be in the range of around 1 kHz to around 10 kHz. In this case, the detected and preprocessed mid-low audio frequency may then be modulated up into a frequency range within the available 1 kHz to 10 kHz range for transmission to the smart phone via the audio input jack. For instance, the 30 Hz to 1 kHz audio content may be modulated up into the 3 kHz to 5 kHz range, and provided to the smart phone via the audio input jack.

In one instance, the modulation may be performed by multiplying the preprocessed audio content by a modulation signal in the time-domain. In one case, the modulation frequency of the modulation signal may be 4 kHz, such that content in the pre-modulated 30 Hz to 1 kHz frequency spectrum may now exist within a pair of sidebands centered on 4 kHz. In other words, the audio content may now exist between 4 kHz and 5 kHz, as well as between 4 kHz and 3 kHz. The presence of both sidebands may be beneficial by way of providing signal duplicity, such that frequency response variation may be adequately corrected if necessary.

In one example, the modulation signal used for time-domain multiplication may be provided by a circuit of analog switches and operational amplifiers included on the microphone device 700. In another example, the modulation signal may be provided by the smart phone. As discussed above, the microphone device may be connected to the smart phone via the audio input jack on the smart phone. In many smart phones, the audio input jack may also be configured to be an audio output jack of the smart phone. As such, the smart phone may be configured to provide the modulation signal to the calibration microphone device via the same audio input/output jack.

In addition, depending on the playback frequency range being calibrated, different modulation frequencies may be appropriate. In such a case, the smart phone being utilized as the calibration device may further be configured to determine the proper modulation frequency for playback calibration for a certain frequency range, and accordingly provide the modulation signal having the determined modulation frequency for multiplying the audio content by. Along similar lines, different smart phones may have different input frequency response ranges. As such, the modulation frequency may further be determined based on the input frequency range of the smart phone. After the preprocessed audio content has been modulated, the modulated audio content may then be provided to the smart phone At block 758, the method 700 may involve providing the modulated audio content for calibration. As indicated above, the modulated audio content may be provided to the smart phone via the audio input jack of the smart phone. The smart phone may be configured to, upon receiving the modulated audio content, further modulate the audio content to effectively demodulate the audio content, thereby effectively generating the originally detected audio content. In the mid-low audio frequency example above, the smart phone may be configured to receive the detected audio content, which has been modulated up to the 3 kHz to 5 kHz range from the 30 Hz to 1 kHz range, and further modulate the received audio content back down to the 30 Hz to 1 kHz range. In one case, modulating the received audio content back down to the 30 Hz to 1 kHz range may be performed by multiplying the received audio content by the same 4 kHz modulation signal used to modulate the audio content previously. The smart phone may then proceed to execute the relevant playback calibration algorithms and processes discussed in the previous section.

VII. Example Signal Processing for Bass Playback Calibration

Figure 8A:
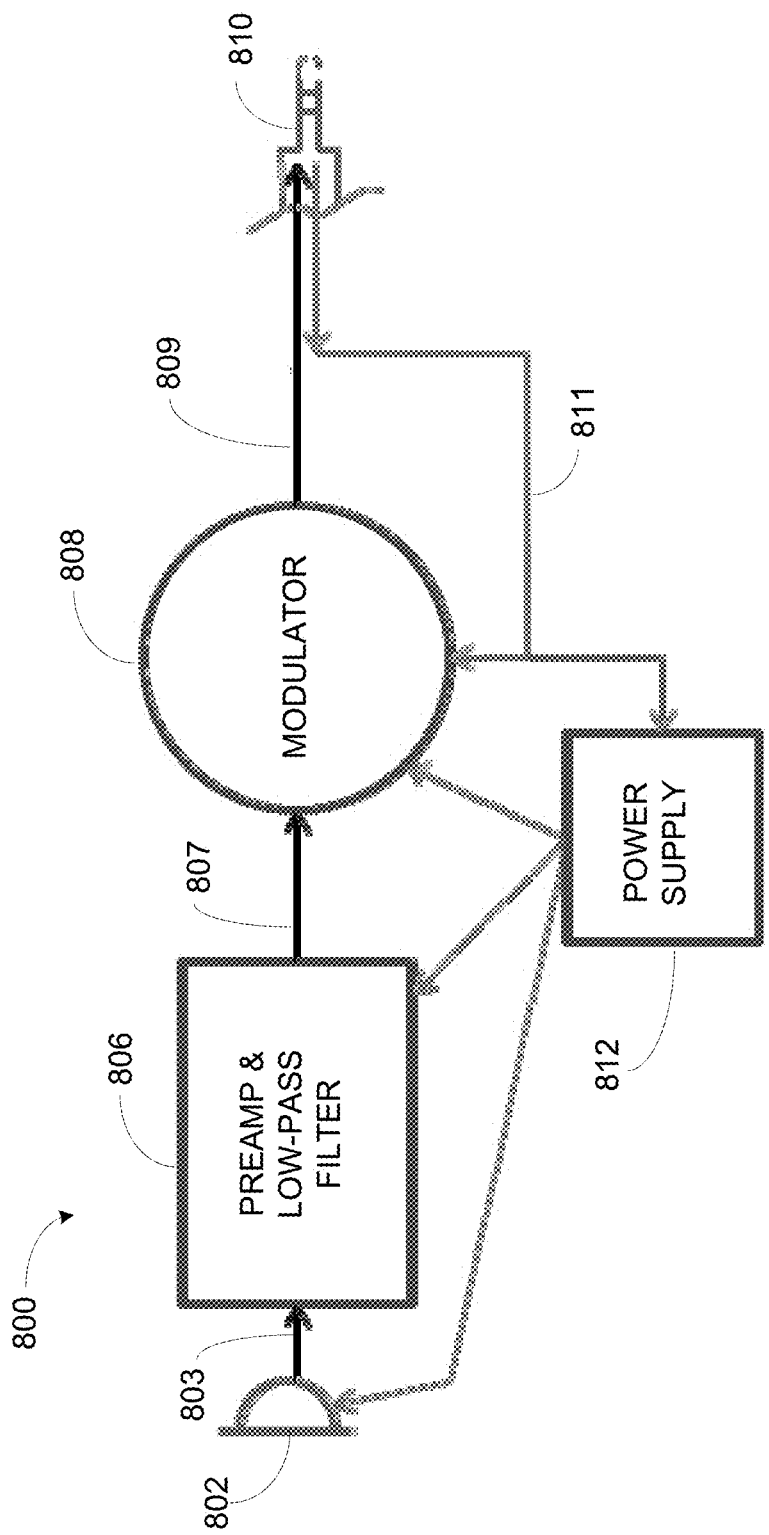
FIG. 8A shows an illustrative signal flow diagram of an example microphone device for playback calibration.
Figure 8B:
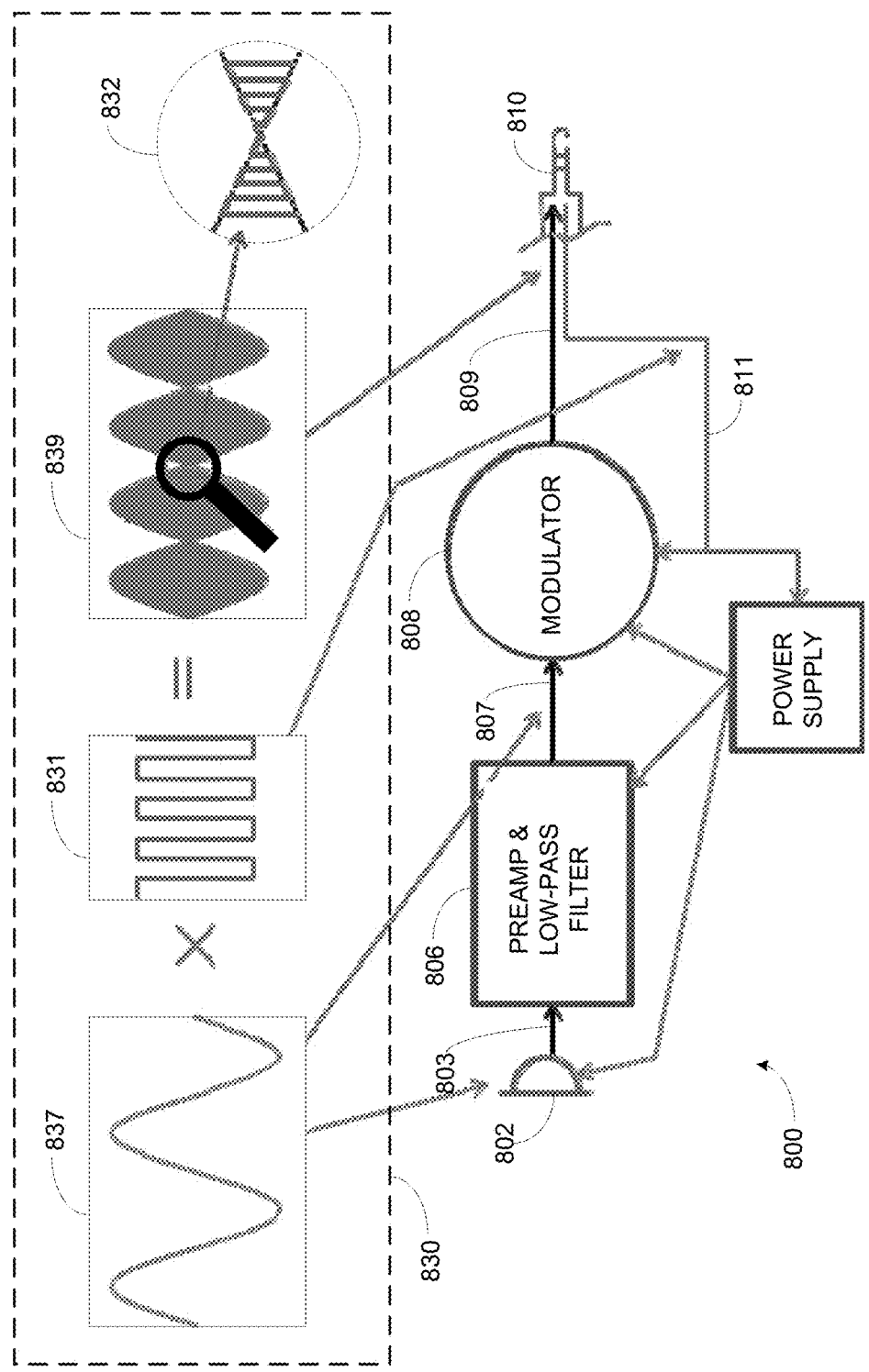
FIG. 8B shows a series of example audio content signals transmitted within the calibration microphone device.
Figure 8C:
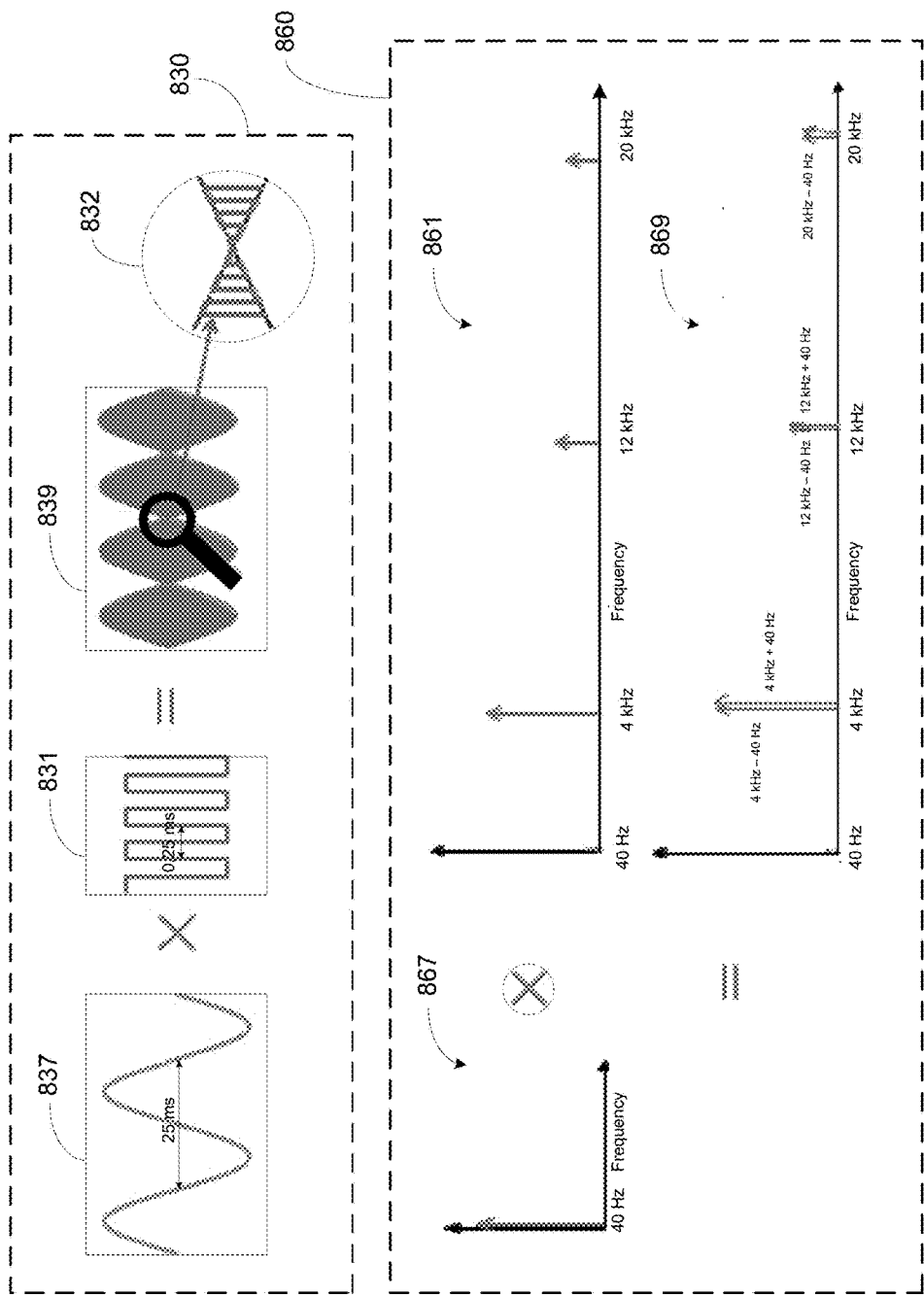
FIG. 8C shows a series of illustrative audio signals for device playback calibration in the time domain and the frequency domain.

To further illustrate the application of a calibration microphone device such as the microphone device 700 of FIG. 7A, the following discussions in connection to FIGS. 8A to 8C provide an example of the signal processing by the calibration microphone for the calibration of low frequency "bass" audio content playback.

FIG. 8A shows an illustrative signal flow diagram of an example microphone device 800 for playback calibration. As shown, the calibration microphone device 800 includes a microphone 802, a signal processor 806, a modulator 808, an audio plug 810, and a power supply 812. In one example, the microphone 802, the signal processor 806, and the modulator 808 may be similar in structure and/or function to the microphone 702, the signal processor 704, and the modulator 710, respectively, of FIG. 7A. In one case, the audio plug 810 may be an audio plug capable of sending and receiving stereo audio signals.

In a further example, the power supply 812 may be configured to power the signal processor 806 and modulator 808. In one case, the calibration microphone device 800 may be powered by the smart phone via the audio plug 810. In this case, if the modulation signal is provided by the smart phone, as previously discussed, the power signal may be a rectified version of the modulation signal, and the power supply 812 may not be necessary.

Also shown in FIG. 8A are signal paths 803, 807, 809, and 811. Signal path 803 represents the transmission of the detected audio content from the microphone 802 to the signal processor 806. Signal path 807 represents the transmission of the preprocessed audio content from the signal processor 806 to the modulator 808. Signal path 809 represents the transmission of the modulated audio content from the modulator 808 to the audio plug 810.

Signal path 811 represents the transmission of the various signals from the smart phone to the calibration microphone device 800 via the audio plug 810. In one example, if the modulation signal is provided by the smart phone, signal path 811 may provide the transmission of the modulation signal to the modulator 808. In another example, as discussed above, the modulation signal from the smart phone may be rectified and used to power components. Further, signal path 811 may provide the transmission of any control inputs from the smart phone to control the calibration microphone device.

FIG. 8B shows a series of example audio content signals 830 illustrating the signals transmitted at each of the signal paths 803, 807, 809, and 811. The first in the series of example audio content signals 830 is an illustrative audio signal 837 detected by the microphone 802. As shown, the audio signal 837 may be in the form of a basic sine wave. The audio signal 837 may be transmitted from the microphone 802 to the signal processor 806 via signal path 803. For illustration purposes, the audio signal 837 in this example may be substantially the same after signal processing by signal processor 806 for an improved signal-to-noise ratio. As such, an audio signal similar to the audio signal 837 may then be transmitted to the modulator 808 via signal path 807.

The second in the series of example audio content signals 830 is an illustrative modulation signal 831 received from the smart phone via signal path 811. As shown, the modulation signal 831 may be in the form of square waves having a higher frequency than the audio signal 837. The third in the series of example audio content signals 830 is an illustrated modulated audio signal 839 produced by the multiplication of the audio signal 837 by the modulation signal 831. The modulation audio signal 839 may then be provided by the modulator 808 to the audio plug 810 via the signal path 809. As shown, the modulated audio signal 839 may be in the form of a square wave enveloped within a bipolar sine wave. A zoomed-in view 832 of the modulated audio signal 839 provides an illustration of the enveloped square wave.

As previously discussed, the modulated audio signal 839 may be the audio signal received by the smart phone via the input jack of the smart phone, and may further be demodulated and processed for playback calibration of the device rendering the audio signal 837 detected by the microphone 802.

FIG. 8C shows a series of illustrative audio signals for device playback calibration in the time domain and the frequency domain. The series of example audio content signals 830 shown and discussed above in connection to FIG. 8B provides an illustration of audio signals in the time domain. A different series of example audio content signals 860 is further provided as an illustration of the audio signals in the frequency domain.

As shown, the audio signal 837 may have a wavelength of 25 milliseconds, and therefore has a frequency of 40 Hz. The audio signal 837 may then be represented in the frequency domain as audio signal 867. Similarly, the modulation signal 831 may have a wavelength of 0.25 milliseconds, and therefore has a frequency of 4 kHz. The modulation signal 831 may then be represented in the frequency domain as modulation signal 861.

Further, the modulated audio signal 839 may be represented in the frequency domain as modulated audio signal 869. As shown, the, the resulting frequency domain modulated audio signal by convolving the audio signal 867 and modulation signal 861 results in the two side bands of 4.96 kHz and 4.04 kHz, centered on the modulation signal frequency of 4 kHz as previously discussed.

VIII. Conclusion

As discussed above, systems and methods are provided for device playback calibration such that the system may provide optimized playback of audio content by playback devices, thereby enriching the listening experience of users.

In an example embodiment of the present application, a system is provided. The system includes at least one playback device rendering audio content, a microphone configured to detect the rendered audio content from a first location relative to the at least one playback device, a signal processor configured to modulate the detected audio content with a modulation signal having a modulation frequency, and a processing unit in communication with the at least one playback device and signal processor. The processing unit is configured to receive the modulated audio content, demodulate the modulated audio content, and determine an equalization setting for the at least one playback device to render audio content based on an analysis of the demodulated audio content.

In another example embodiment of the present application, a device for playback calibration of at least one playback device is provided. The device includes a microphone configured to detect audio content rendered by the at least one playback device, and a signal processor configured to modulate the detected audio content for transmission to a processing unit configured to determine an equalization setting for the at least one playback device.

In yet another example embodiment of the present application, a method is provided for determining a first distance and direction of a playback device, causing the playback device to render audio content, receiving a first modulated version of the rendered audio content, and determining an equalization setting of the playback device based on the first modulated version of the rendered audio content, and the first distance and direction of the playback device.

The description discloses various example systems, methods, apparatus, and articles of manufacture including, among other components, firmware and/or software executed on hardware. However, such examples are merely illustrative and should not be considered as limiting. For example, it is contemplated that any or all of these firmware, hardware, and/or software components could be embodied exclusively in hardware, exclusively in software, exclusively in firmware, or in any combination of hardware, software, and/or firmware. Accordingly, while the following describes example systems, methods, apparatus, and/or articles of manufacture, the examples provided are not the only way(s) to implement such systems, methods, apparatus, and/or articles of manufacture.

Additionally, reference herein to "embodiment" means that a particular feature, structure, or characteristic described in connection with the embodiment can be included in at least one example embodiment of the invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible medium such as a memory, DVD, CD, Blu-ray, and so on, storing the software and/or firmware.

The invention claimed is:

1. A tangible non-transitory computer-readable medium having stored thereon instructions executable by a computing device to perform functions comprising:
   receiving, via a microphone, detected audio content rendered by at least one playback device;
   modulating the detected audio content with a modulation signal, wherein the modulation signal has a modulation frequency determined based on an input frequency range of a processing unit;
   providing the modulated audio content to the processing unit; and
   determining, via the processing unit, an equalization setting for the at least one playback device.

2. The tangible non-transitory computer-readable medium of claim 1, wherein the functions further comprise:
   prior to modulating the detected audio content with the modulation signal, determining the input frequency range of the processing unit.

3. The tangible non-transitory computer-readable medium of claim 1, wherein determining the equalization setting for the at least one playback device comprises determining, via the processing unit, the equalization setting based on a frequency spectrum of the audio content prior to modulation.

4. The tangible non-transitory computer-readable medium of claim 1, wherein modulating the detected audio content with the modulation signal comprises:
   multiplying the detected audio content with the modulation signal.

5. The tangible non-transitory computer-readable medium of claim 1, wherein the modulation frequency is 4 kilohertz.

6. The tangible non-transitory computer-readable medium of claim 1, wherein the functions further comprise:
   prior to modulating the detected audio content, applying a low-pass filter to the detected audio content.

7. The tangible non-transitory computer-readable medium of claim 6, wherein applying the low-pass filter to the detected audio content comprises removing frequency components of the detected audio content above 1 kilohertz.

8. The tangible non-transitory computer-readable medium of claim 1, wherein the functions further comprise:
   causing the at least one playback device to apply the equalization setting.

9. The tangible non-transitory computer-readable medium of claim 8, wherein causing the at least one playback device to apply the equalization setting, comprises causing data indicating the equalization setting to be transmitted to the at least one playback device.

10. A method comprising:
    receiving, via a computing device from a microphone, detected audio content rendered by at least one playback device;
    modulating, via the computing device, the detected audio content with a modulation signal, wherein the modulation signal has a modulation frequency determined based on an input frequency range of a processing unit;
    providing, via the computing device, the modulated audio content to the processing unit; and
    determining, via the processing unit, an equalization setting for the at least one playback device.

11. The method of claim 10, further comprising:
    prior to modulating the detected audio content with the modulation signal, determining, via the computing device, the input frequency range of the processing unit.

12. The method of claim 10, wherein determining the equalization setting for the at least one playback device comprises determining the equalization setting based on a frequency spectrum of the audio content prior to modulation.

13. The method of claim 10, wherein modulating the detected audio content with the modulation audio content comprises:
    multiplying the detected audio content with the modulation signal.

14. The method of claim 10, further comprising:
prior to modulating the detected audio content, applying a low-pass filter to the detected audio content.

15. The method of claim 10, further comprising:
causing the at least one playback device to apply the equalization setting.

16. A computing device comprising:
one or more processors; and
memory having stored thereon instructions executable by the one or more processors to cause the computing device to perform a method comprising:
receiving, via a microphone, detected audio content rendered by at least one playback device;
modulating the detected audio content with a modulation signal, wherein the modulation signal has a modulation frequency determined based on an input frequency range of a processing unit;
providing the modulated audio content to the processing unit; and
determining, via the processing unit, an equalization setting for the at least one playback device.

17. The computing device of claim 16, wherein the method further comprises:
prior to modulating the detected audio content with the modulation signal, determining the input frequency range of the processing unit.

18. The computing device of claim 16, wherein determining the equalization setting for the at least one playback device comprises determining the equalization setting based on a frequency spectrum of the audio content prior to modulation.

19. The computing device of claim 16, wherein the method further comprises:
prior to modulating the detected audio content, applying a low-pass filter to the detected audio content.

20. The computing device of claim 16, wherein the method further comprises:
causing the at least one playback device to apply the equalization setting.

* * * * *